(12) United States Patent
Lee et al.

(10) Patent No.: US 10,396,088 B2
(45) Date of Patent: Aug. 27, 2019

(54) THREE-DIMENSIONAL SEMICONDUCTOR DEVICE

(71) Applicant: Samsung Electronics Co., Ltd., Suwon-si, Gyeonggi-do (KR)

(72) Inventors: Sohyeon Lee, Suwon-si (KR); Sunil Shim, Seoul (KR); Jaeduk Lee, Seongnam-si (KR); Jaehoon Jang, Seongnam-si (KR); Jeehoon Han, Hwaseong-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 37 days.

(21) Appl. No.: 15/696,276

(22) Filed: Sep. 6, 2017

(65) Prior Publication Data
US 2018/0294274 A1 Oct. 11, 2018

(30) Foreign Application Priority Data
Apr. 10, 2017 (KR) .................. 10-2017-0046229

(51) Int. Cl.
| | |
|---|---|
| *H01L 27/11565* | (2017.01) |
| *H01L 27/1157* | (2017.01) |
| *H01L 27/11582* | (2017.01) |
| *H01L 23/52* | (2006.01) |
| *H01L 23/528* | (2006.01) |
| *H01L 21/768* | (2006.01) |
| *H01L 23/522* | (2006.01) |

(52) U.S. Cl.
CPC .. *H01L 27/11565* (2013.01); *H01L 21/76816* (2013.01); *H01L 21/76877* (2013.01); *H01L 23/528* (2013.01); *H01L 23/5226* (2013.01); *H01L 27/1157* (2013.01); *H01L 27/11582* (2013.01)

(58) Field of Classification Search
CPC ........ H01L 27/11565; H01L 21/76877; H01L 21/76816; H01L 23/528; H01L 27/11582; H01L 27/1157; H01L 23/5226
USPC ....................................................... 257/326
See application file for complete search history.

(56) References Cited

U.S. PATENT DOCUMENTS

| | | |
|---|---|---|
| 8,115,245 B2 | 2/2012 | Yoshimizu et al. |
| 9,362,298 B2 | 6/2016 | Akutsu et al. |
| 9,406,814 B2 | 8/2016 | Shinohara |
| 9,431,420 B2 | 8/2016 | Hwang |

(Continued)

FOREIGN PATENT DOCUMENTS

KR 10-2018-0000656 A 1/2018

*Primary Examiner* — Caleen O Sullivan
(74) *Attorney, Agent, or Firm* — Harness, Dickey & Pierce, P.L.C.

(57) ABSTRACT

A three-dimensional semiconductor device and a method of manufacturing the same are provided. The three-dimensional semiconductor device includes a stack structure including insulating layers and electrodes that are alternately stacked on a substrate, a horizontal semiconductor pattern between the substrate and the stack structure, vertical semiconductor patterns penetrating the stack structure and connected to the horizontal semiconductor pattern; and a common source plug at a side of the stack structure. The stack structure, the horizontal semiconductor pattern and the common source plug extend in a first direction. The horizontal semiconductor pattern includes a first sidewall extending in the first direction. The first sidewall has protrusions protruding toward the common source plug.

20 Claims, 30 Drawing Sheets

(56) References Cited

U.S. PATENT DOCUMENTS

| | | |
|---|---|---|
| 9,520,407 B2 | 12/2016 | Fukuzumi et al. |
| 2010/0232224 A1 | 9/2010 | Maeda et al. |
| 2016/0071873 A1 | 3/2016 | Tsuji et al. |
| 2016/0260736 A1 | 9/2016 | Fujii et al. |
| 2016/0268282 A1 | 9/2016 | Ishibashi |
| 2016/0343730 A1 | 11/2016 | Son et al. |

THREE-DIMENSIONAL SEMICONDUCTOR DEVICE

CROSS-REFERENCE TO RELATED APPLICATION

This application claims priority under 35 U.S.C. § 119 to Korean Patent Application No. 10-2017-0046229 filed on Apr. 10, 2017 in the Korean Intellectual Property Office, the disclosure of which is hereby incorporated by reference in its entirety.

TECHNICAL FIELD

Example embodiments of the present disclosure relate to a three-dimensional semiconductor device, and, more specifically, to a three-dimensional semiconductor device having improved reliability.

DISCUSSION OF RELATED ART

A semiconductor device is highly integrated to meet demands of high performance and low costs. For example, an integration degree of a two-dimensional (2D) or planar semiconductor device is mainly determined by an area used for a unit memory cell. Therefore, the integration density of the 2D or planar semiconductor device depends on a technique used for a fine pattern formation. However, high-cost equipment is required for such a fine pattern formation in a 2D or planar semiconductor manufacturing process and increase of the integration density of the 2D or planar semiconductor device is limited.

A three-dimensional semiconductor device including three-dimensional memory cells has been developed to overcome the above limitations.

SUMMARY

According to example embodiments of the inventive concepts, a three-dimensional semiconductor memory device may include a stack structure including insulating layers and electrodes that are alternately stacked on a substrate, a horizontal semiconductor pattern between the substrate and the stack structure, vertical semiconductor patterns penetrating the stack structure and connected to the horizontal semiconductor pattern, and a common source plug at a side of the stack structure. The stack structure, the horizontal semiconductor pattern and the common source plug may extend in a first direction. The horizontal semiconductor pattern may have a first sidewall extending in the first direction. The first sidewall may include protrusions protruding toward the common source plug.

According to example embodiments of the inventive concepts, a three-dimensional semiconductor memory device may include a stack structure, on a substrate, extending in a first direction and including electrodes vertically stacked while being spaced apart from one another, a horizontal semiconductor pattern between the substrate and the stack structure, the horizontal semiconductor pattern extending in the first direction, and vertical semiconductor patterns penetrating the stack structure and connected to the horizontal semiconductor pattern. The horizontal semiconductor pattern may have a first sidewall extending in the first direction. In plan view, the first sidewall may have an uneven profile along the first direction.

According to example embodiments of the inventive concepts, a method of manufacturing a three-dimensional semiconductor device may include forming a lower layer on a substrate, forming a mold structure in which insulating layers and first sacrificial layers are alternately stacked on the lower layer, forming channel holes penetrating the mold structure and arranged in a first direction, forming a recess region by selectively etching the lower layer through the channel holes, and forming a horizontal semiconductor pattern in the recess region and vertical semiconductor patterns in the channel holes by filling the channel holes and the recess region with a semiconductor material. The horizontal semiconductor pattern may have a first sidewall extending in the first direction. The first sidewall may include protrusions protruding in a second direction crossing the first direction.

BRIEF DESCRIPTION OF THE DRAWINGS

FIGS. 7A to 14A are cross-sectional views illustrating a method of manufacturing a three-dimensional semiconductor device according to example embodiments, taken along line I-I' of FIG. 3.

FIGS. 7B to 14B are cross-sectional views illustrating a method of manufacturing a three-dimensional semiconductor device according to example embodiments, taken along line II-II' of FIG. 3.

DETAILED DESCRIPTION OF THE EMBODIMENTS

Various example embodiments will now be described more fully with reference to the accompanying drawings in which some example embodiments are shown. However, the inventive concepts may be embodied in many alternate forms and should not be construed as limited to only example embodiments set forth herein.

Figure 1:
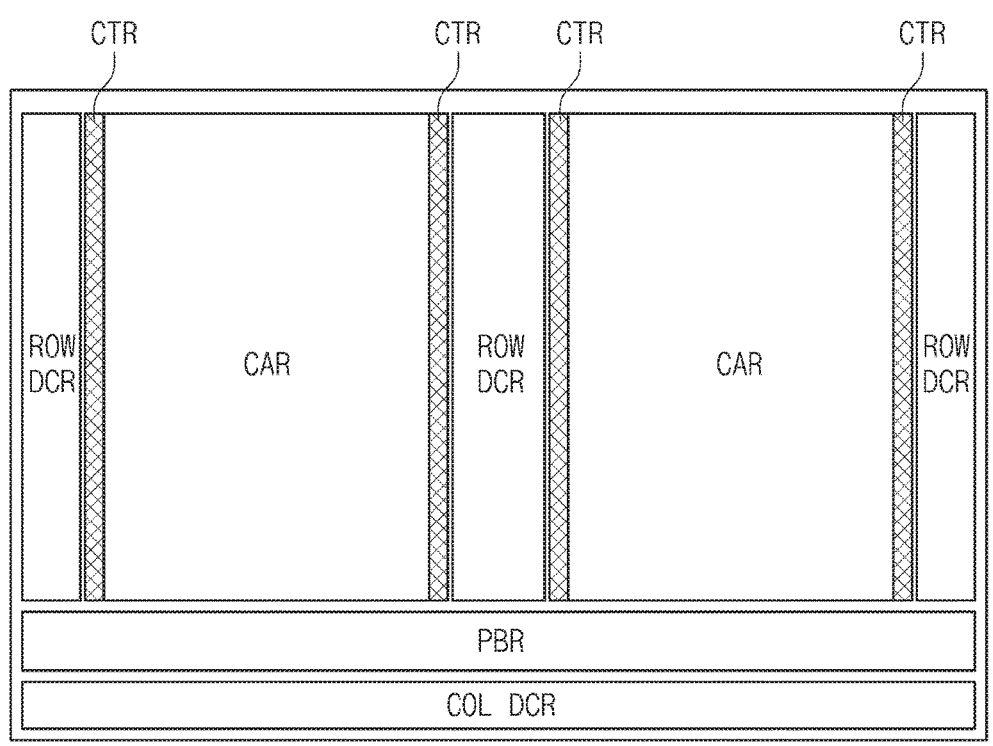
FIG. 1 is a schematic view illustrating a three-dimensional semiconductor device according to example embodiments.

FIG. 1 is a schematic view illustrating a three-dimensional semiconductor device according to example embodiments.

Referring to FIG. 1, a three-dimensional (3-D) semiconductor device may include a cell array region CAR and a peripheral circuit region. The peripheral circuit region may include row decoder regions ROW DCR, a page buffer region PBR, a column decoder region COL DCR and a control circuit region. In some embodiments, a connection region CTR may be disposed between the call array region CAR and the row decoder regions ROW DCR.

A memory cell array including a plurality of memory cells may be disposed in the cell array region CAR. In some embodiments, the cell array may include the memory cells arrayed in three dimensions, a plurality of word lines connected to the memory cells and a plurality of bit lines connected to the memory cells.

A row decoder for selecting the word lines of the memory cell array may be disposed in the row decoder region ROW DCR. Interconnection structures for electrically connecting the memory cell array and the row decoder may be disposed in the connection region CTR. The row decoder may select one of the word lines in accordance with an address information and may provide a word line voltage to the selected word line and the unselected word lines in response to a control signal of a control circuit in the control circuit region.

In the page buffer region PBR, a page buffer for reading data stored in the memory cells may be disposed. The page buffer may temporarily store data to be stored in the memory cells or may sense the data stored in the memory cells, according to an operation mode. The page buffer may operate as a write driver circuit in a program operation mode and may operate as a sense amplifier circuit in a read operation mode.

A column decoder may be disposed in the column decoder region COL DCR to be connected to the bit lines of the memory cell array. The column decoder may provide a data transmission path between the page buffer and an external device (e.g., a memory controller).

Figure 2:
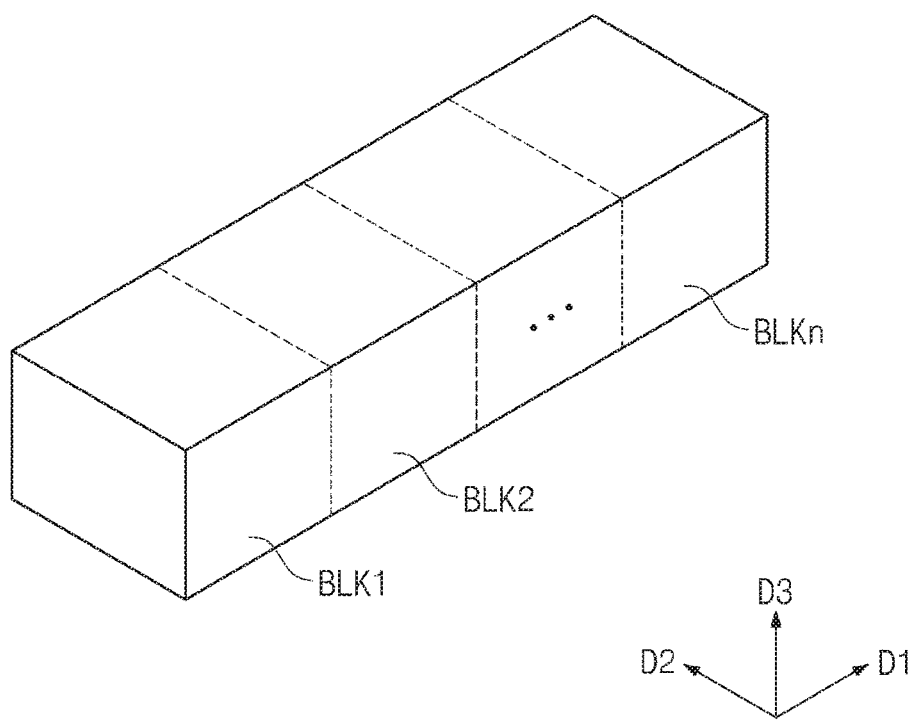
FIG. 2 is a schematic block diagram view illustrating a cell array of a three-dimensional semiconductor device according to example embodiments.

FIG. 2 is a schematic block diagram view illustrating a cell array of a three-dimensional semiconductor device according to example embodiments.

Referring to FIG. 2, a cell array CAR may include a plurality of cell array blocks BLK1, BLK2, . . . , BLKn. The cell array blocks BLK1, BLK2, . . . , BLKn may each include a stack structure including electrodes which are stacked in a third direction D3 on a plane extending in first and second directions D1 and D2. The stack structure may configure three-dimensionally arranged memory cells along with a plurality of vertical structures (or semiconductor pillars). In an embodiment, the cell array blocks BLK1, BLK2, . . . , BLKn may each include bit lines that are electrically connected to the memory cells.

Figure 3:
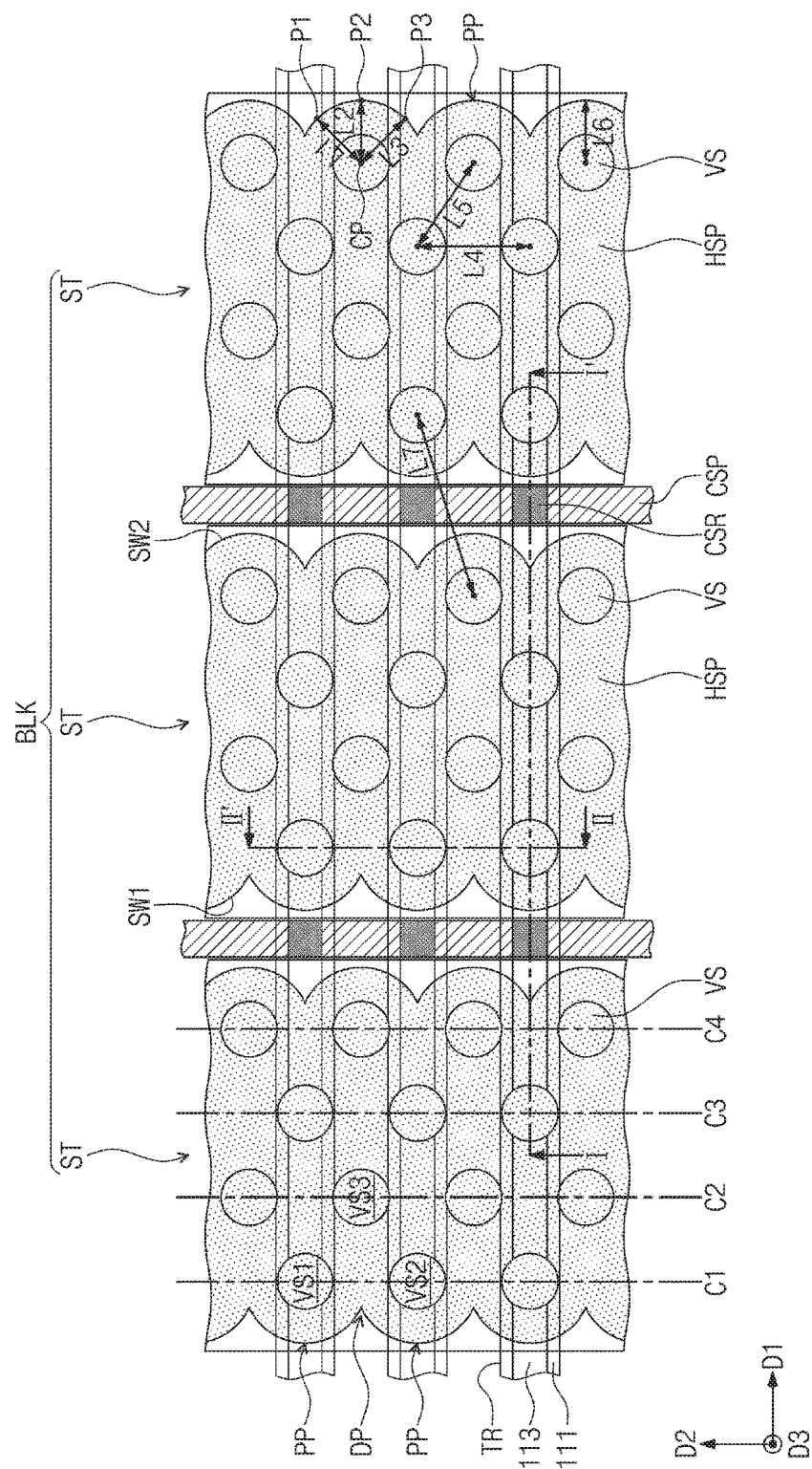
FIG. 3 is a plan view illustrating a three-dimensional semiconductor device according to example embodiments.
Figure 4A:
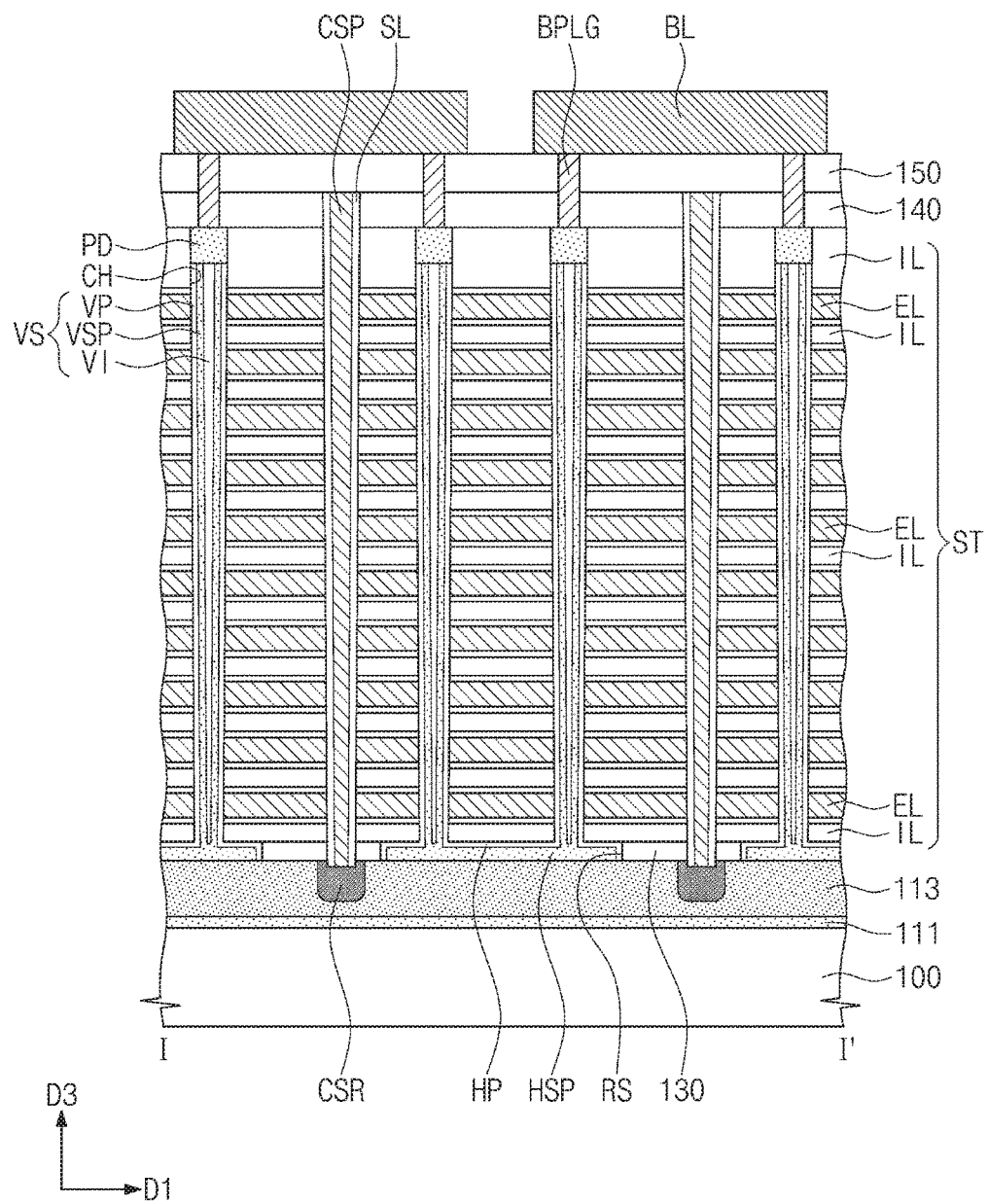
FIGS. 4A and 4B are cross-sectional views taken along lines I-I' and II-II', respectively, of FIG. 3, illustrating a three-dimensional semiconductor device according to example embodiments.
Figure 4B:
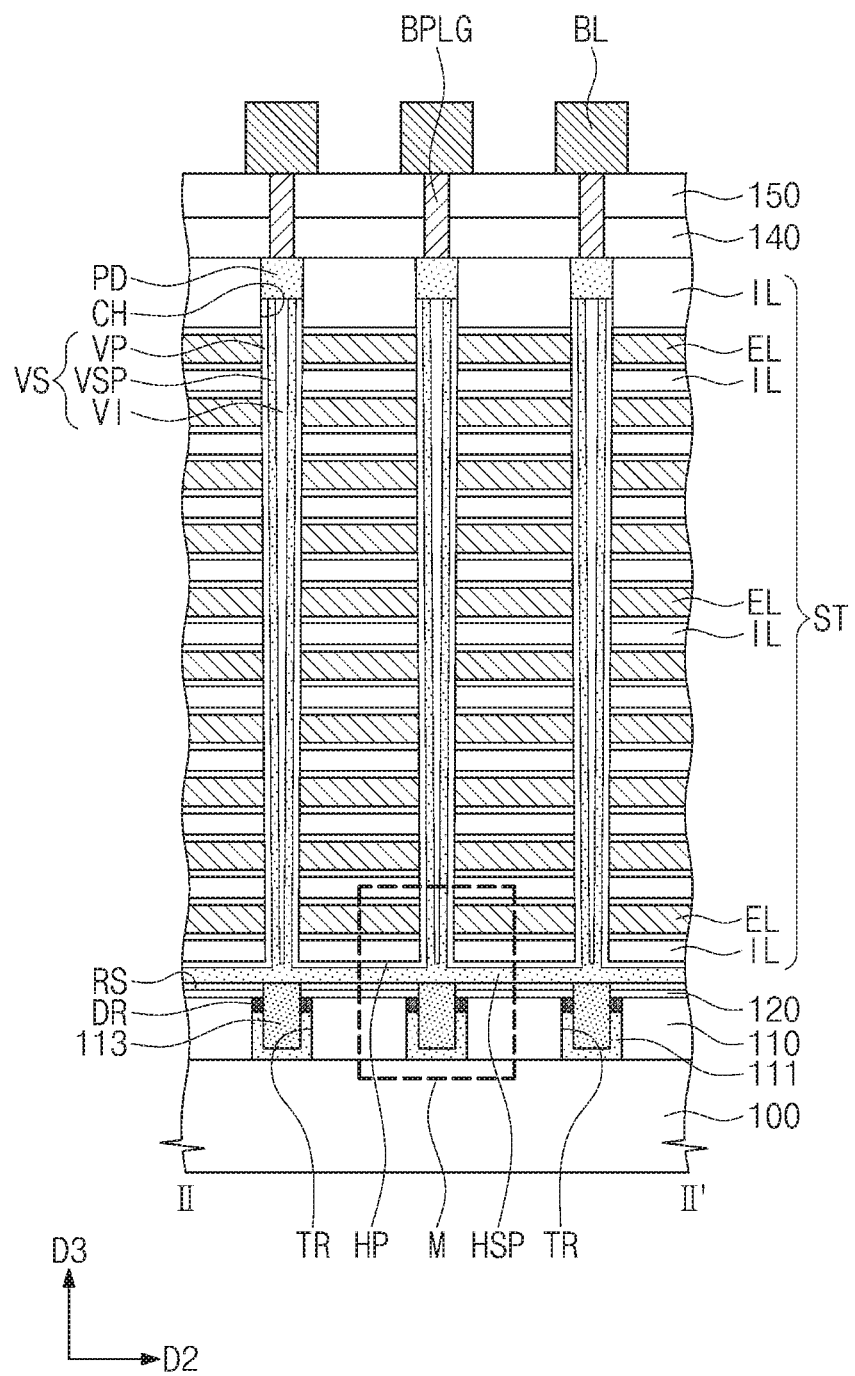
Figure 5:
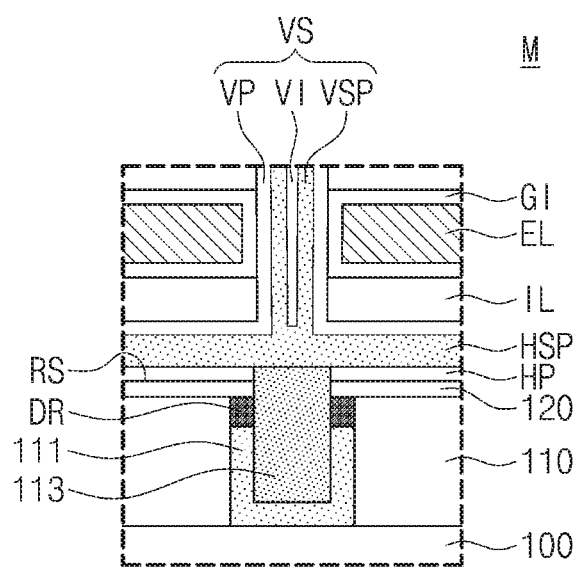
FIG. 5 is an enlarged view illustrating portion M of FIG. 4B.
Figure 6:
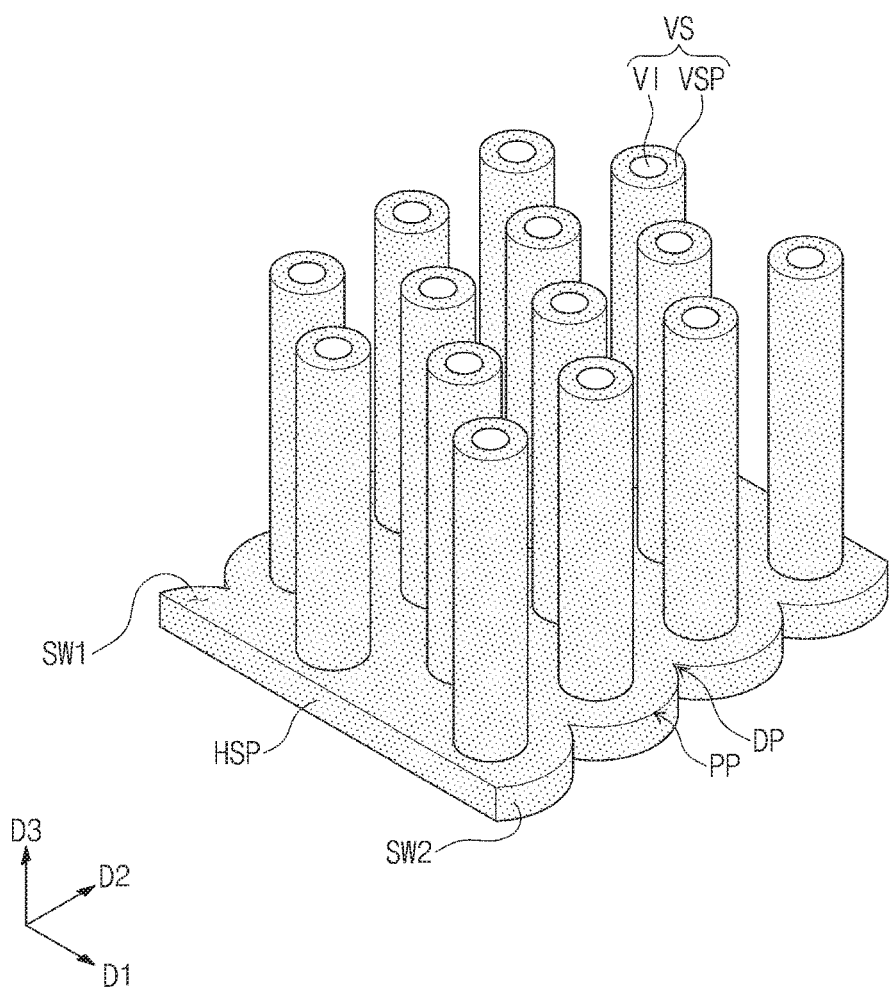
FIG. 6 is a perspective view illustrating a horizontal semiconductor pattern and a vertical semiconductor pattern according to example embodiments.

FIG. 3 is a plan view illustrating a three-dimensional semiconductor device according to example embodiments. FIGS. 4A and 4B are cross-sectional views taken along lines I-I' and II-II', respectively, of FIG. 3, illustrating a three-dimensional semiconductor device according to example embodiments. FIG. 5 is an enlarged view illustrating portion M of FIG. 4B. FIG. 6 is a perspective view illustrating a horizontal semiconductor pattern and a vertical semiconductor pattern according to example embodiments.

Referring to FIGS. 3, 4A, 4B, 5 and 6, lower insulating patterns 110 may be disposed on a substrate 100. The lower insulating patterns 110 may extend in a first direction D1 parallel to an upper surface of the substrate 100. The lower insulating patterns 110 may be arranged to be spaced apart from one another in a second direction D2 perpendicular to the first direction D1. In some embodiments, the substrate 100 may include a silicon substrate, a germanium substrate or a silicon-germanium substrate. The lower insulating patterns 110 may include silicon oxide, silicon nitride or silicon oxynitride.

Trenches TR may be defined between adjacent lower insulating patterns 110. The trenches TR may extend in the first direction D1. Each of first connection semiconductor patterns 111 may fill at least a part of each corresponding trench TR. For example, the first connection semiconductor patterns 111 may be conformally formed in the trenches TR. Each of the first connection semiconductor patterns 111 may directly cover sidewalls of the lower insulating patterns 110 and the upper surface of the substrate 100. An upper portion of each of the first connection semiconductor patterns 111 may include an impurity region DR. The impurity region DR may be a blocking layer containing an impurity (e.g., carbon).

Second connection semiconductor patterns 113 may fill gap regions, each of which is defined by each of the first connection semiconductor patterns 111. Upper portions of the second connection semiconductor patterns 113 may vertically protrude above the lower insulating patterns 110. Upper surfaces of the second connection semiconductor patterns 113 may be higher than upper surfaces of the lower insulating patterns 110 relative to the upper surface of the substrate 100. The second connection semiconductor patterns 113 may have a first conductivity type (e.g., a p-type).

The first and second connection semiconductor patterns 111 and 113 in the trenches TR may extend in the first direction D1. The first and second connection semiconductor patterns 111 and 113 may be arranged to be spaced apart from one another in the second direction D2. In some embodiments, the first and second connection semiconductor patterns 111 and 113 may include mono-crystalline silicon, polycrystalline silicon, mono-crystalline germanium or polycrystalline germanium. In other embodiments, the first and second connection semiconductor patterns 111 and 113 may include a carbon nano-structure, an organic semiconductor material or a compound semiconductor material.

A buffer insulating layer 120 may be disposed on the lower insulating patterns 110. The buffer insulating layer 120 may include, for example, a silicon oxide. The buffer insulating layer 120 may be formed by a thermal oxidation process or a deposition process, for example.

A cell array block BLK may be disposed on the substrate 100. The cell array block BLK may include stack structures ST. The stack structures ST may be disposed on the buffer insulating layer 120. The stack structures ST may extend in the second direction D2. The stack structures ST may be arranged to be spaced apart from one another in the first direction D1. The stack structures ST may each include insulating layers IL and electrodes EL which are vertically alternately stacked on the substrate 100.

Common source regions CSR may be disposed in the second connection semiconductor patterns 113. In plan view, each of the common source regions CSR may be disposed between adjacent stack structures ST. The common source regions CSR may be arranged to be spaced apart from one another in the second direction D2, between respective pairs of the stack structures ST. The common source regions CSR may be doped with an impurity to have a second conductivity type. For example, the common source regions CSR may be doped with an impurity such as arsenic (As) or phosphorus (P) to have an n-type.

Common source plugs CSP may each be disposed between a pair of adjacent stack structures ST. The common source plugs CSP may be connected to the common source regions, respectively. The common source plugs CSP may extend parallel to the stack structures ST in the second direction D2. The common source plugs CSP may each have a linear shape extending in the second direction. The common source plugs CSP may each have a width in the first direction D1, gradually decreasing toward the substrate 100. Insulating spacers SL may be disposed between the pair of adjacent stack structures ST and each of the common source plugs CSP.

The common source plugs CSP may include doped semiconductor (e.g., doped silicon, etc.), metal (e.g., tungsten, copper, aluminum, etc.), conductive metal nitride (e.g., titanium nitride, tantalum nitride, etc.) and/or transition metal (e.g., titanium, tantalum, etc.). The insulating spacers SL may include silicon oxide, silicon nitride or silicon oxynitride.

The electrodes EL of each of the stack structures ST may be stacked in a third direction vertical to the upper surface of the substrate 100. The electrodes EL may be vertically separated from each other by each of the insulating layers IL therebetween. A lowermost electrode EL of each of the stack structures ST may be a lower selection line. An uppermost electrode EL of each of the stack structures ST may be an upper selection line. The other electrodes EL except for the lower selection line and the upper selection line may be word lines.

For example, the electrodes EL may include, for example, doped semiconductor (e.g., doped silicon, etc.), metal (e.g., tungsten, copper, aluminum, etc.), conductive metal nitride (e.g., titanium nitride, tantalum nitride, etc.) and/or transition metal (e.g., titanium, tantalum, etc.). The insulating layers IL may include silicon oxide, for example.

Vertical structures VS may be disposed to penetrate each of the stack structures ST. The vertical structures VS may be arranged in the second direction D2, in a plan view. The vertical structures VS may be arranged in a zigzag manner or in a row, along the second direction D2. The vertical structures VS may each have a cylindrical shape. The vertical structures VS may each have a diameter gradually decreasing toward the substrate 100.

In some embodiments, first to fourth columns CL1, CL2, CL3 and CL4 of the vertical structures VS may be arranged as shown in FIG. 3 to penetrate each of the stack structures ST. Each of the first to fourth columns CL1-CL4 may include the vertical structures VS arranged in a row along the second direction D2. The first to fourth columns CL1-CL4 may be arranged to be spaced apart from one another in the first direction D1. As an example, the vertical structures ST of the second column C2 may not overlap the vertical structures ST of the first and third columns C1 and C3 in the first direction D1. As an example, the vertical structures ST of the third column C3 may not overlap the vertical structures ST of the second and fourth columns C1 and C4 in the first direction D1.

Each of the vertical structures VS may include a vertical insulating pattern VP, a vertical semiconductor pattern VSP and a buried insulating pattern VI. The vertical insulating pattern VP may be provided at a side portion of each of the vertical structures VS and may vertically extend from a top of the vertical structure VS toward the substrate 100. The vertical semiconductor pattern VSP may extend along an inner surface of the vertical insulating pattern VP toward the substrate 100. The vertical semiconductor pattern VSP may have a pipe shape or a macaroni shape, of which a bottom end is closed. The buried insulating pattern VI may fill the inside of the vertical semiconductor pattern VSP. A conductive pad PD may be disposed on each of the vertical structures VS. The conductive pad PD may include a conductive material such as metal or doped semiconductor.

A lower layer 130, horizontal insulating patterns HP and horizontal semiconductor patterns HSP may be disposed between the substrate 100 and each of the stack structures ST. The lower layer 130, the horizontal insulating patterns HP and the horizontal semiconductor patterns HSP may be disposed on the buffer insulating layer 120. The horizontal insulating patterns HP and the horizontal semiconductor patterns HSP may be disposed in recess regions RS in the lower layer 130. The horizontal insulating patterns HP may directly cover inner surfaces of the recess regions RS. The horizontal semiconductor patterns HSP may be disposed on inner surfaces of the horizontal insulating patterns HP. The lower layer 130 may include at least one of a polysilicon layer, a silicon carbide layer, a silicon-germanium layer, silicon nitride layer and a silicon oxynitride layer. As an example, the lower layer 130 may be an un-doped polysilicon layer.

In plan view, each of the horizontal semiconductor patterns HSP may overlap each of the stack structures ST thereabove. Each of the horizontal semiconductor patterns HSP may extend parallel to a corresponding one of the stack structures ST thereabove in the second direction D2. A maximum width of each of the horizontal semiconductor patterns HSP in the first direction D1 may be less than a maximum width of each of the stack structures ST in the first direction D1. For example, each of the horizontal semiconductor patterns HSP may be laterally spaced apart from the common source plugs CSP at opposite sides of each of the stack structures ST.

Each of the horizontal semiconductor patterns HSP may have a first sidewall SW1 extending in the second direction D2 and a second sidewall SW2 opposite to the first sidewall SW1 and extending in the second direction D2. In plan view, one of the first and second sidewalls SW1 and SW2 may have an uneven profile (e.g., a wavy profile) along the second direction D2, as shown in FIG. 3. For example, one of the first and second sidewalls SW1 and SW2 may have protrusions PP protruding toward an adjacent common source plug CSP. In plan view, the protrusions PP may each have a curvature greater than zero. A depression DP may be defined between a pair of adjacent protrusions PP.

For example, a first vertical structure VS1 and a second vertical structure VS2 of the first column C1 may be adjacent to a pair of adjacent protrusions PP, respectively. The depression DP between the pair of adjacent protrusions PP may be disposed between the first and second vertical structures VS1 and VS2. A third vertical structure VS3 of the second column C2 may be adjacent to the first and second vertical structures VS1 and VS2 in an oblique direction to the first direction D1. The depression DP may be toward the third vertical structure VS3 of the second column C2.

Referring to FIG. 3, in plan view, a concentric circle of the protrusion PP may substantially overlap a concentric circle of the vertical structure VS that is immediately adjacent thereto. A distance between an arbitrary first point P1 of the protrusion PP and the central point CP of the vertical structure VS may be a first length L1. A distance between an arbitrary second point P2 of the protrusion PP and the central point CP of the vertical structure VS may be a second length L2. A distance between an arbitrary third point P3 of the protrusion PP and the central point CP of the vertical structure VS may be a third length L3. In this case, the first to third lengths L1, L2 and L3 may be substantially the same.

A distance between the central points of the vertical structures VS that are adjacent to each other in the second direction D2 may be a fourth length L4. A distance between the central points of the vertical structures ST that are adjacent to each other in a direction crossing the first and second directions D1 an D2 may be a fifth length L5. For example, the fourth length L4 may be greater than the fifth length L5. The fourth length L4 may be less than two times the first length L1 (L4<2×L1). The fifth length L5 may also be less than two times the first length L1 (L5<2×L1).

Any one of the vertical structures VS may be adjacent to a sidewall of the stack structure ST that extends in the second direction D2. A distance between the central point of the any one of the vertical structures VS and the sidewall of the stack structure ST may be a sixth length L6. The sixth length L6 may be less than the first length L1 (L6<L1).

A first stack structure ST and a second stack structure ST of the stack structures ST may be adjacent to each other. The shortest distance between a central point of the vertical structure VS of the first stack structure ST and a central point of the vertical structure VS of the second stack structure ST may be a seventh length L7. The seventh length L7 may be greater than two times the first length L1 (L7>2×L1). For example, The seventh length L7 may be 3 to 10 times the first length L1.

Referring again to FIGS. 3, 4A, 4B, 5 and 6, a plurality of vertical semiconductor patterns VSP may be directly connected to one horizontal semiconductor pattern HSP, as shown in FIG. 6. For example, the vertical semiconductor patterns VSP of the first to fourth columns C1-C4 may penetrate one stack structure ST to be directly connected to the horizontal semiconductor pattern HSP below the stack structure ST. The horizontal semiconductor pattern HSP and the vertical semiconductor patterns VSP connected thereto may be an integrally coupled semiconductor pattern. The vertical and horizontal semiconductor patterns VSP and HSP may include the same material.

For example, the vertical and horizontal semiconductor patterns VSP and HSP may include silicon, germanium or a mixture thereof. The vertical and horizontal semiconductor patterns VSP and HSP may have a mono-crystalline, poly-crystalline or amorphous structure. The vertical and horizontal semiconductor patterns VSP and HSP may be doped with an impurity of the first conductivity type the same as the substrate 100 or may not be doped. The horizontal semiconductor pattern HSP and the vertical semiconductor patterns VSP connected thereto may be used as a channel of the three-dimensional semiconductor device according to the example embodiments.

A plurality of vertical insulating patterns VP may be directly connected to one horizontal insulating pattern HP. For example, the vertical insulating patterns VP of the first to fourth columns C1-C4 may penetrate one stack structure ST to be directly connected to the horizontal insulating pattern HP below the stack structure ST. The horizontal insulating pattern HP and the vertical insulating patterns VP connected thereto may be an integrally coupled insulating pattern. The horizontal insulating pattern HP and the vertical insulating patterns VP connected thereto may be formed at the same time through the same process.

The second connection semiconductor patterns 113 may penetrate the buffer insulating layer 120 and the horizontal insulating pattern HP below the horizontal semiconductor pattern HSP to be connected to the horizontal semiconductor pattern HSP as shown in FIG. 5. The second connection semiconductor patterns 113 may each extend in the first direction D1 and may electrically connect the horizontal semiconductor patterns HSP that are spaced apart from one another in the first direction D1. The second connection semiconductor patterns 113 may electrically connect the horizontal semiconductor patterns HSP and the first connection semiconductor patterns 111. The vertical and horizontal semiconductor patterns VSP and HSP may be electrically connected to the substrate 100 via the first and second connection semiconductor patterns 111 and 113.

Gate insulating patterns GI may be interposed between the electrodes EL and the vertical structures VS and between the electrodes EL and the insulating layers IL. The vertical insulating pattern VP and the gate insulating pattern GI between the electrode EL and the vertical structure VS may configure a data storage layer. The three-dimensional semiconductor device according to the example embodiments may be a NAND flash memory device. For example, the data storage layer between the electrode EL and the vertical semiconductor pattern VSP may include a tunnel insulating layer, a charge storage layer and a blocking insulating layer. The tunnel insulating layer may directly contact the vertical semiconductor pattern VSP. The blocking insulating layer may directly contact the electrode EL. The charge storage layer may be disposed between the tunnel insulating layer and the blocking insulating layer. Data stored in the data storage layer may be changed using Fowler-Nordheim (FN) tunneling caused by a voltage difference between the electrode EL and the vertical semiconductor pattern VSP.

The tunnel insulating layer may include a material having an energy band gap greater than the charge storage layer. The tunnel insulating layer may include silicon oxide or a high-k dielectric material such as an aluminum oxide or hafnium oxide. The charge storage layer may include silicon nitride, silicon oxynitride or silicon-rich nitride. The blocking insulating layer may include silicon oxide.

In some embodiments, the gate insulating pattern GL between the electrode EL and the vertical semiconductor pattern VSP may include the blocking insulating layer, and the vertical insulating pattern VP between the electrode EL and the vertical semiconductor pattern VSP may include the charge storage layer and the tunnel insulating layer. In other embodiments, the gate insulating pattern GL between the electrode EL and the vertical semiconductor pattern VSP may include the blocking insulating layer and the charge storage layer, and the vertical insulating pattern VP between the electrode EL and the vertical semiconductor pattern VSP may include the tunnel insulating layer.

A first interlayer insulating layer 140 and the second interlayer insulating layer 150 may be disposed on the stack structures ST. Bit lines BL may be disposed on the second interlayer insulating layer 150 and may extend in the first direction D1 across the stack structures ST. The bit lines BL may each be electrically connected to the vertical semiconductor pattern VSP of each of the vertical structures VS through a bit line contact plug BPLG and the conductive pad PD.

In the three-dimensional semiconductor device according to the example embodiments, a spaced distance D1 between the horizontal semiconductor patterns HSP in the first direction D1 may be greater than a spaced distance between the stack structures ST in the first direction D1. Thus, a process margin for forming the common source plugs CSP may be obtained, thereby preventing shorts between the common source plugs CSP and the horizontal semiconductor patterns HSP. Accordingly, reliability and electrical characteristics of the three-dimensional semiconductor device may be enhanced.

FIGS. 7A to 14A are cross-sectional views illustrating a method of manufacturing a three-dimensional semiconductor device according to example embodiments, taken along line I-I' of FIG. 3. FIGS. 7B to 14B are cross-sectional views illustrating a method of manufacturing a three-dimensional semiconductor device according to example embodiments, taken along line II-II' of FIG. 3.

Figure 7A:
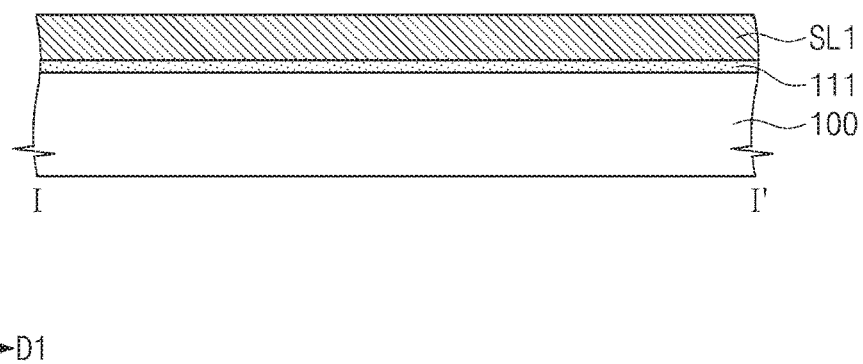
Figure 7B:
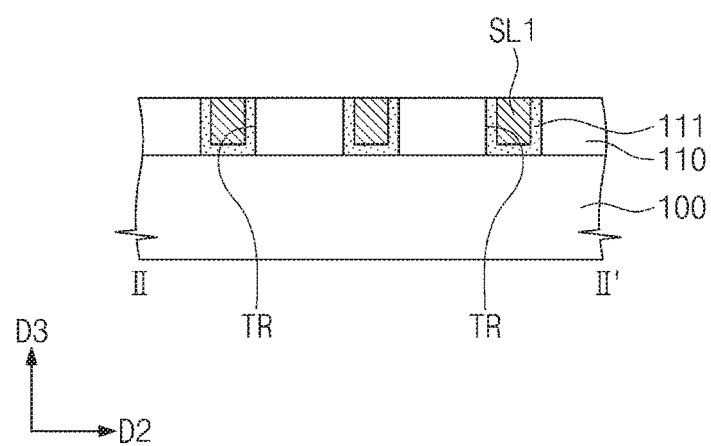

Referring to FIGS. 3, 7A and 7B, lower insulating patterns 110 may be formed on a substrate 100. The formation of the lower insulating patterns 110 may include forming a lower insulating layer on the substrate 100 and patterning the lower insulating layer to form trenches TR extending in a first direction D1 parallel to an upper surface of the substrate 100. The lower insulating layer may include silicon oxide, silicon nitride or silicon oxynitride. The lower insulating patterns 110 may extend in the first direction D1.

First connection semiconductor patterns 111 and first sacrificial patterns SL1 may be formed in the trenches TR between the lower insulating patterns 110. The formation of the first connection semiconductor patterns 111 and the first sacrificial patterns SL1 may include forming a first semiconductor layer to conformally cover the trenches TR, forming a first sacrificial layer to fill the trenches TR having the first semiconductor layer therein, and planarizing the first sacrificial layer and the first semiconductor layer to expose upper surfaces of the lower insulating patterns 110.

The first semiconductor layer may be formed by a chemical vapor deposition (CVD) process or an atomic layer deposition (ALD) process. In some embodiments, the first semiconductor layer may be formed of mono-crystalline silicon, polycrystalline silicon, mono-crystalline germanium or polycrystalline germanium. In other embodiments, the first semiconductor layer may be formed of a carbon nanostructure, an organic semiconductor material or a compound semiconductor material.

The first connection semiconductor patterns 111 may each include a bottom portion contacting the upper surface of the substrate 100 and side portions extending from the bottom portion to sidewalls of the lower insulating patterns 110. The bottom and side portions of each of the first connection semiconductor patterns 111 may define a gap region.

The first sacrificial patterns SL1 may fill the gap regions of the first connection semiconductor patterns 111, respectively. The first sacrificial patterns SL1 may be formed of a material having an etch selectivity to the lower insulating patterns 110 and the first connection semiconductor patterns 111. The first sacrificial patterns SL1 may include, for example, at least one of polysilicon, silicon carbide, silicon-germanium, silicon oxynitride and silicon nitride.

Figure 8A:
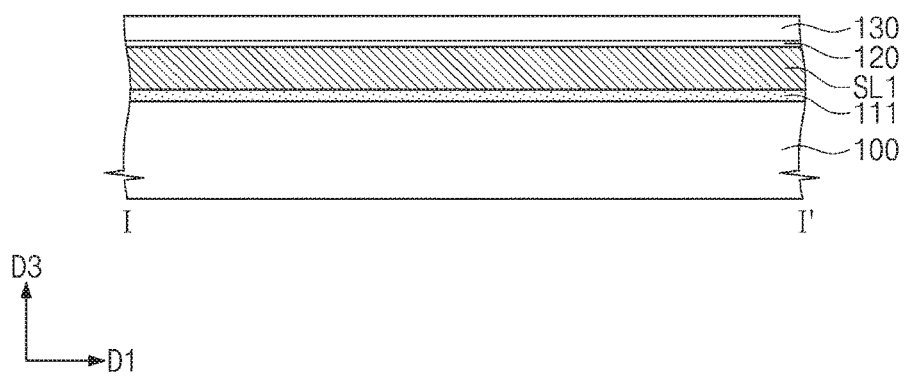
Figure 8B:
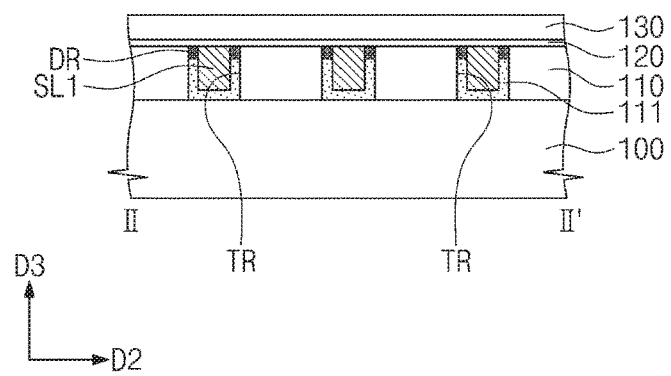

Referring to FIGS. 3, 8A and 8B, a buffer insulating layer 120 and a lower layer 130 may be sequentially formed on the lower insulating patterns 110. The buffer insulating layer 120 may include a silicon oxide layer formed by a thermal oxidation process or a deposition process. The lower layer 130 may include for example, at least one of polysilicon, silicon carbide, silicon-germanium, silicon oxynitride and silicon nitride. For example, the lower layer 130 may be a undoped polysilicon layer.

In some embodiments, before forming the buffer insulating layer 120, upper portions of the first connection semiconductor patterns 111 may be doped with an impurity (e.g., carbon) to form impurity regions DR.

Figure 9A:
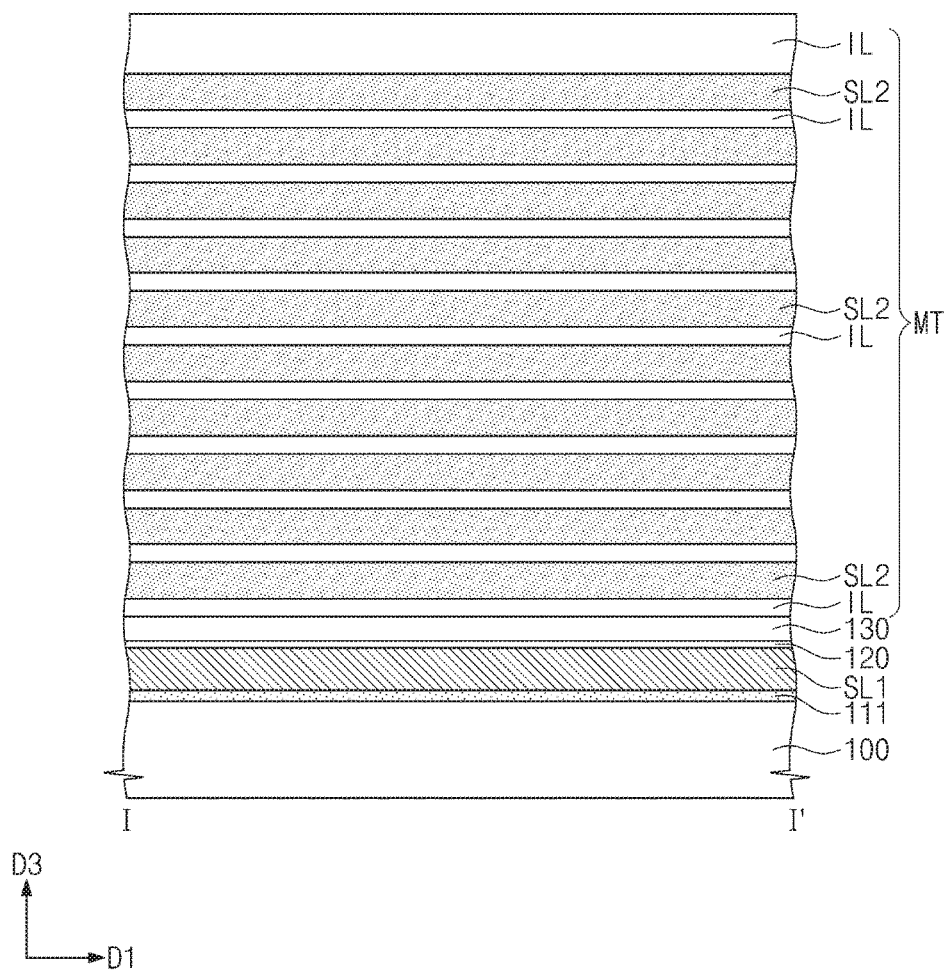
Figure 9B:
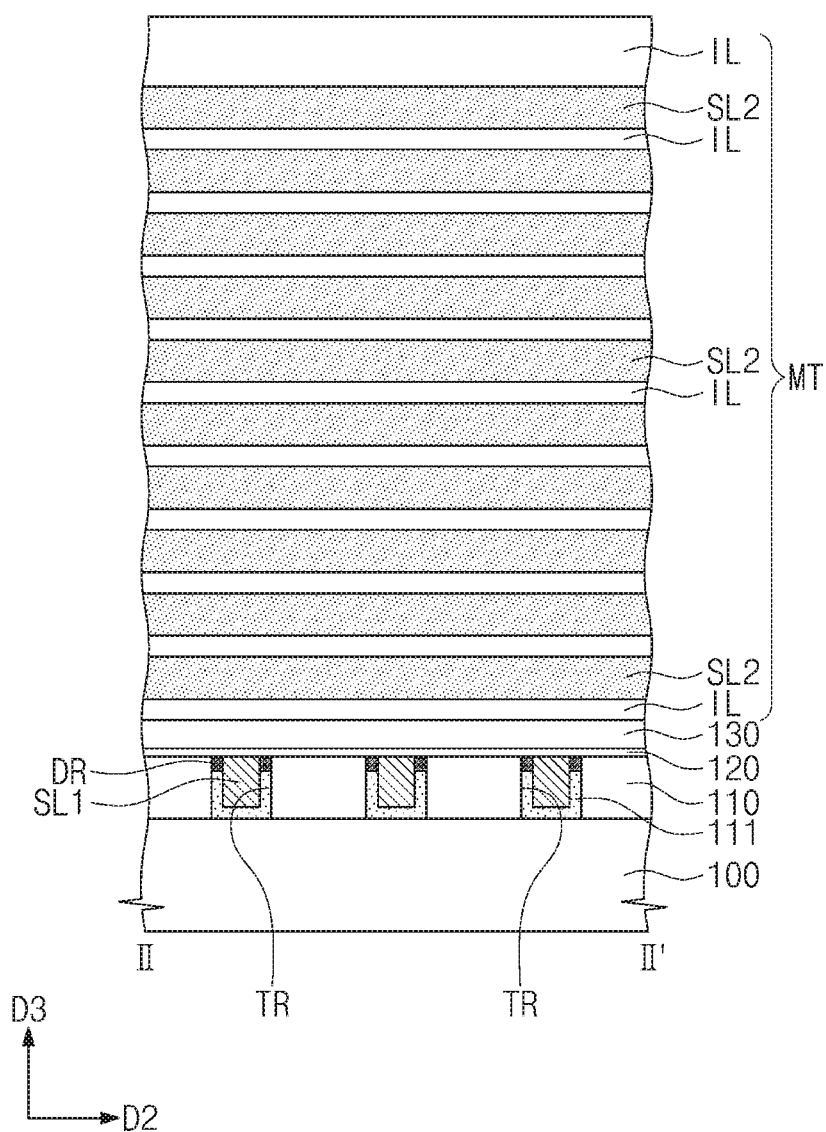

Referring to FIGS. 3, 9A and 9B, a mold structure MT in which insulating layers IL and second sacrificial layers SL2 may be alternately stacked on the lower layer 130 may be formed. The insulating layers IL and the second sacrificial layers SL2 may be formed by a thermal CVD process, a plasma enhanced CVD process, a physical vapor deposition process or an ALD process. The insulating layers IL may be formed of silicon oxide. The second sacrificial layers SL2 may include a material having an etch selectivity to the insulating layers IL. The second sacrificial layers SL2 may be formed of silicon nitride or silicon oxynitride.

Figure 10A:
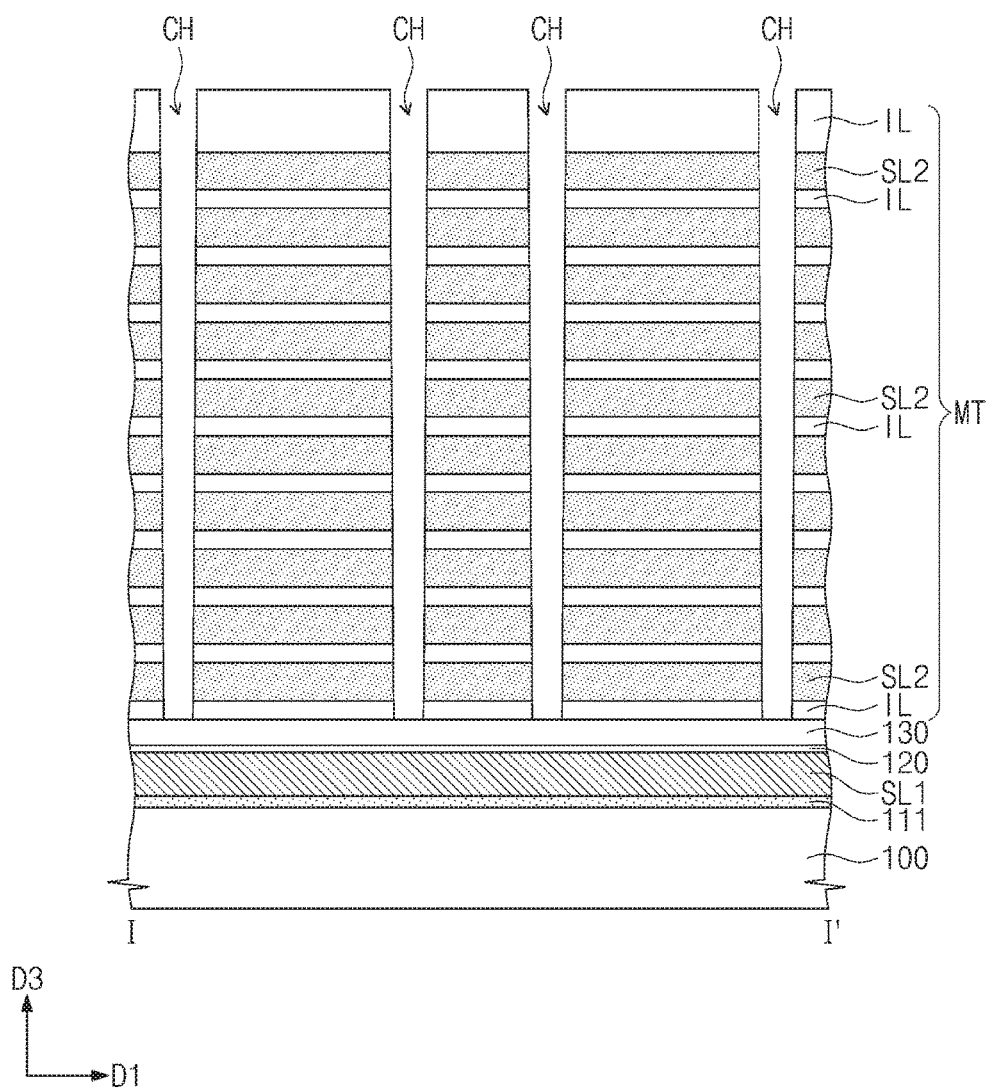
Figure 10B:
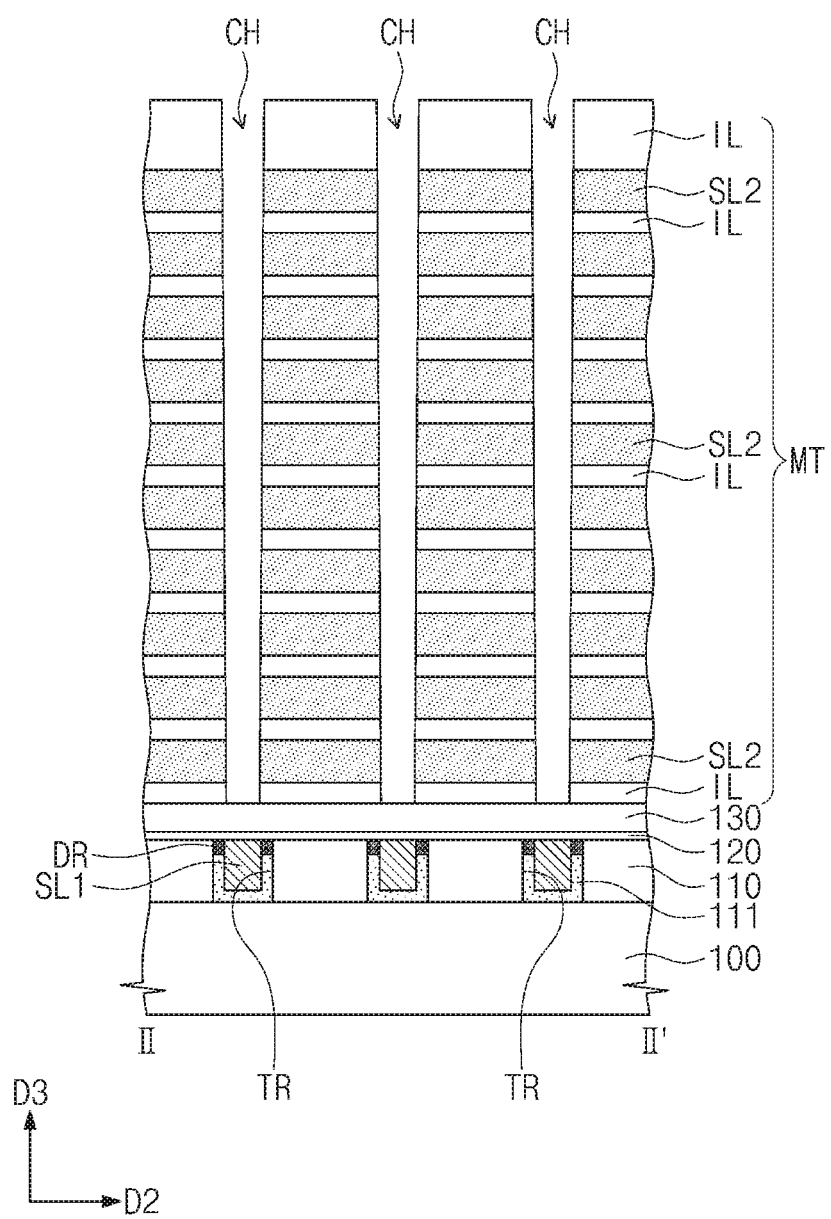

Referring to FIGS. 3, 10A and 10B, channel holes CH may be formed to penetrate the mold structure MT and to expose the lower layer 130. A diameter of each of the channel holes CH may gradually decrease toward the substrate 100. In plan view, an arrangement and shapes of the channel holes CH may be the same as or similar to those of the vertical structures VS described in FIGS. 3, 4A, 4B, 5 and 6.

The formation of the channel holes CH may include forming a mask pattern having openings defining regions where the channel holes CH are to be formed and etching the mold structure MT using the mask pattern as an etch mask. Thereafter, the mask pattern may be removed.

Figure 11A:
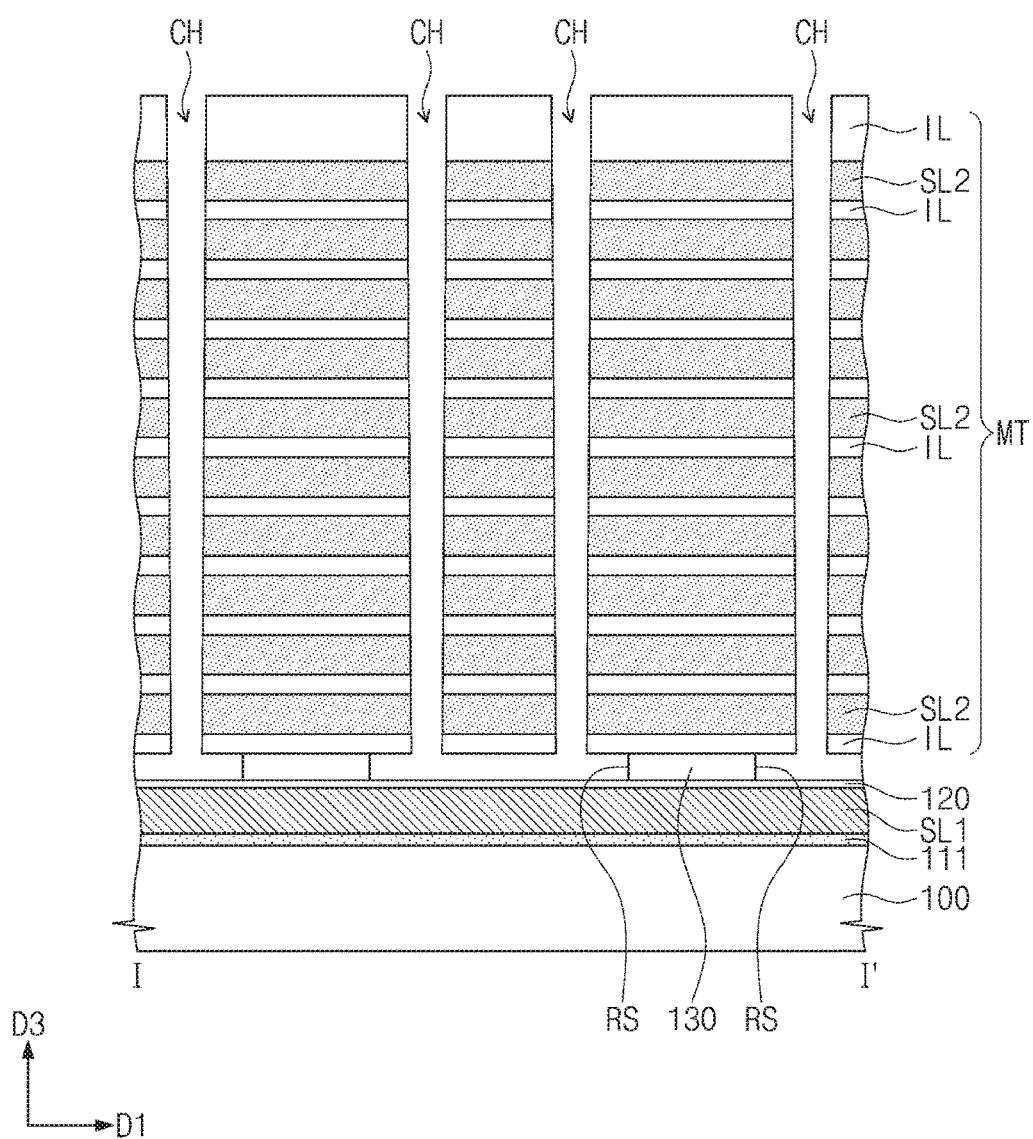
Figure 11B:
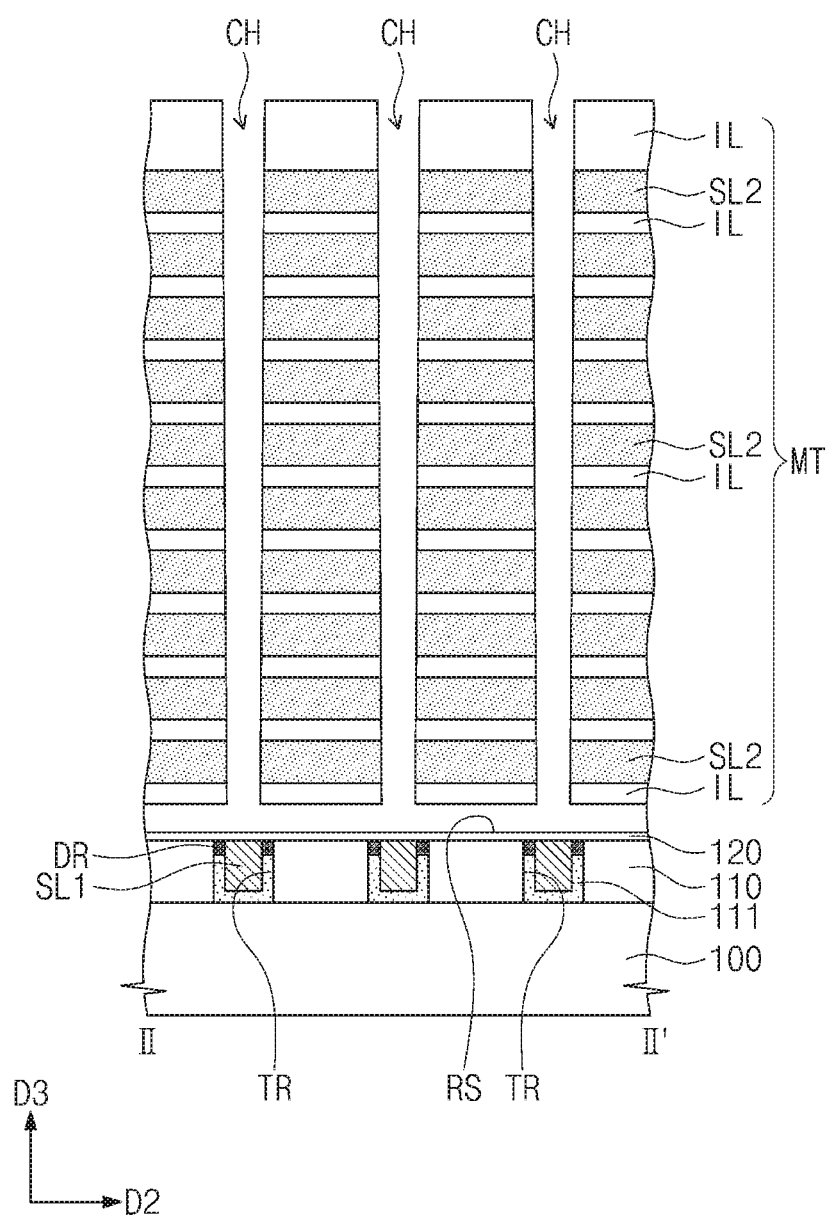
Figure 12A:
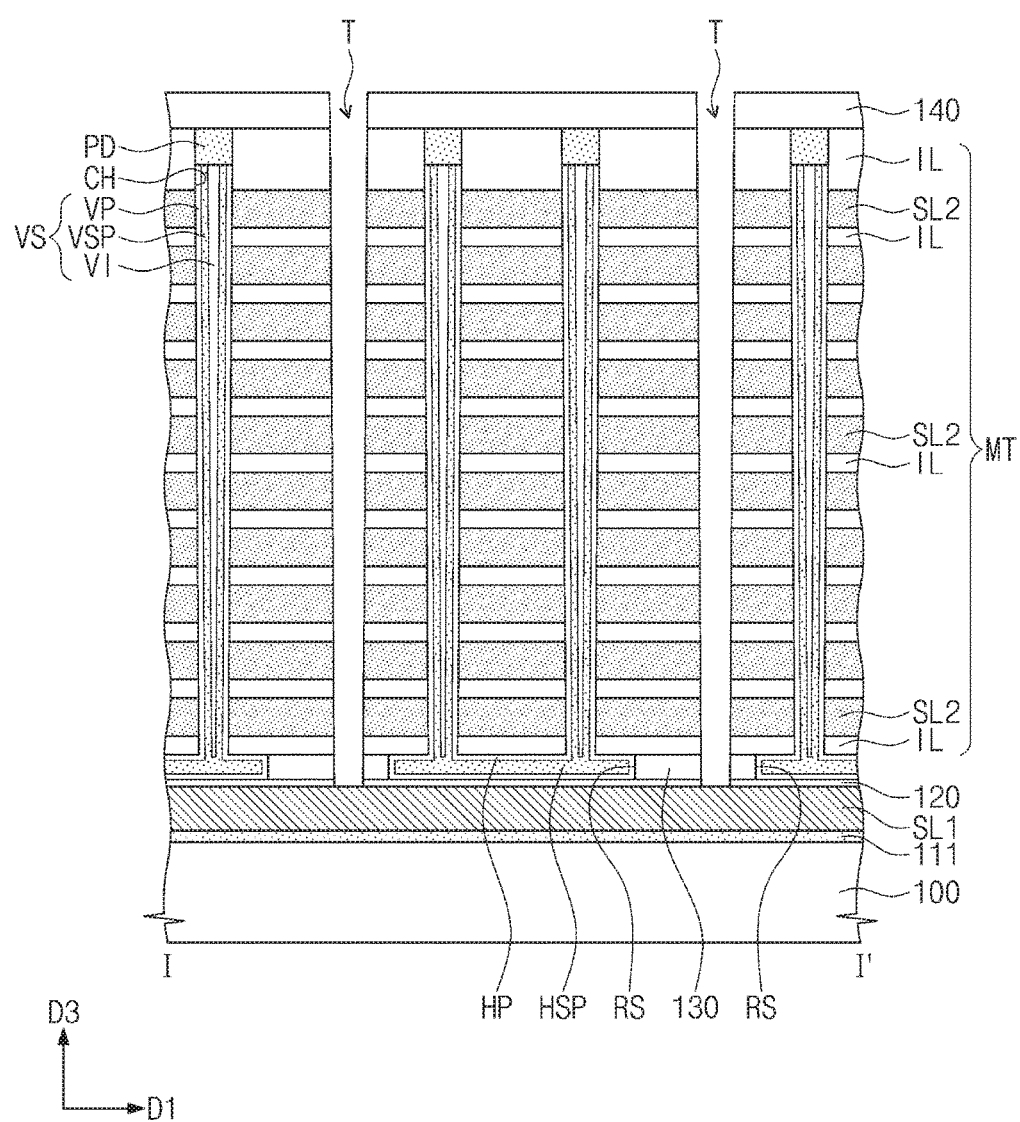
Figure 12B:
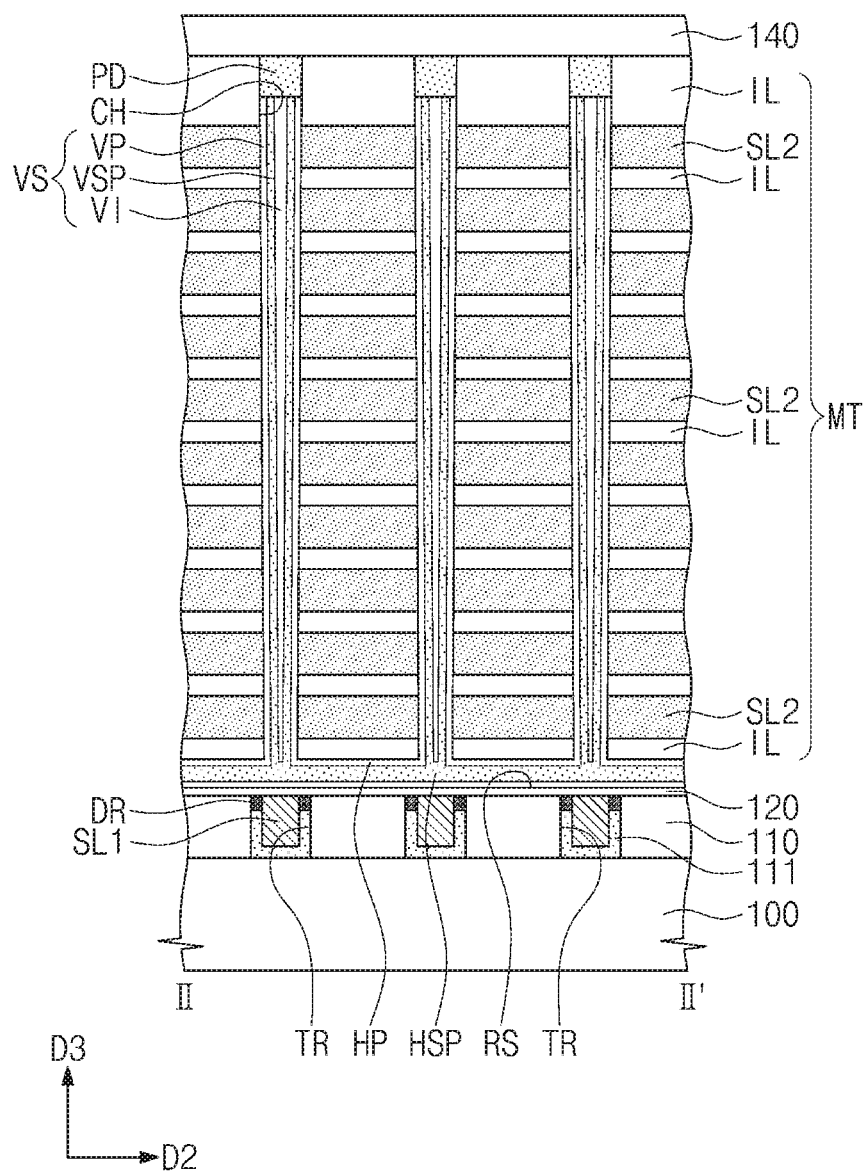

Referring to FIGS. 3, 11A and 11B, a wet etch process may be performed on the lower layer 130 exposed by the channel holes CH to form recess regions RS. For example, an etchant may be supplied to the lower layer 130 through the channel holes CH, and thus the lower layer 130 may be laterally etched by the etchant.

The wet etch process may be performed using an etch recipe having an etch selectivity to the second sacrificial layers SL2, the insulating layers IL and the buffer insulating layer 120. The lower layer 130 around the channel holes CH may be isotropically etched by the wet etch process. The wet etch process may be performed until removing completely the lower layer 130 between the channel holes CH that are adjacent in a second direction D2 crossing the first direction D1. A portion of the lower layer 130 that is spaced more than a predetermined distance apart from the channel holes CH may remain without being removed. The remaining portion of the lower layer 130 may be act as a supporter to support the mold structure MT.

In plan view, shapes of the recess regions RS may be the same as or similar to the horizontal semiconductor patterns HSP described in FIGS. 3, 4A, 4B, 5 and 6. In plan view, at least one sidewall of the recess regions RS may have an uneven profile (e.g., a wavy profile) along the second direction D2. In plan view, some portions of the at least one sidewall of the recess regions RS may have concentric circles substantially overlapping concentric circles of the channel holes adjacent thereto, respectively Referring to FIGS. 3, 12A, 12B, vertical structures VS may be formed in the channel holes CH. The vertical structures VS may each include a vertical insulating pattern VP, a vertical semiconductor pattern VSP and a buried insulating pattern VI. Horizontal insulating patterns HP and horizontal semiconductor patterns HSP may be formed in the recess regions RS.

For example, a first insulating layer may be conformally formed in the recess regions RS and the channel holes CH to form the vertical insulating patterns VP and the horizontal insulating patterns HP. The first insulating layer may be formed using an ALD process or a CVD process. The first insulating layer may include at least one of a tunnel insulating layer, a charge storage layer and a blocking insulating layer that are used as a data storage layer.

Thereafter, a second semiconductor layer may be conformally in the channel holes CH and the recess regions RS to form the vertical semiconductor patterns VSP and the horizontal semiconductor patterns HSP. The second semiconductor layer may be formed to completely fill the recess regions RS. The second semiconductor layer may be formed using an ALD process or a CVD process. For example, the second semiconductor layer may include silicon, germanium or a mixture thereof.

A second insulating layer may be formed on the vertical semiconductor patterns VSP to completely fill the channel holes CH such that the buried insulating patterns VI may be formed. Conductive pads PD may be respectively formed in upper portions of the channel holes CH and on the vertical structures VS. The conductive pads PD may include a conductive material such as doped semiconductor or metal.

A first interlayer insulating layer 140 may be formed on the mold structure MT. The first interlayer insulating layer 140 and the mold structure MT may be patterned to form vertical trenches T exposing portions of the first sacrificial patterns SL1. The vertical trenches T may extend in the second direction D2 and may penetrate the mold structure MT. The vertical trenches T may be formed to have bottom surfaces lower than bottom surfaces of the horizontal semiconductor patterns HSP relative to the upper surface of the substrate 100. The vertical trenches T may be formed to be spaced apart from the horizontal semiconductor patterns HSP. The vertical trenches T may divide the mold structure MT into multiple separate mold structures MT. The multiple vertical structures MT may extend in the second direction D2 and may be spaced from one another in the first direction D1.

Figure 13A:
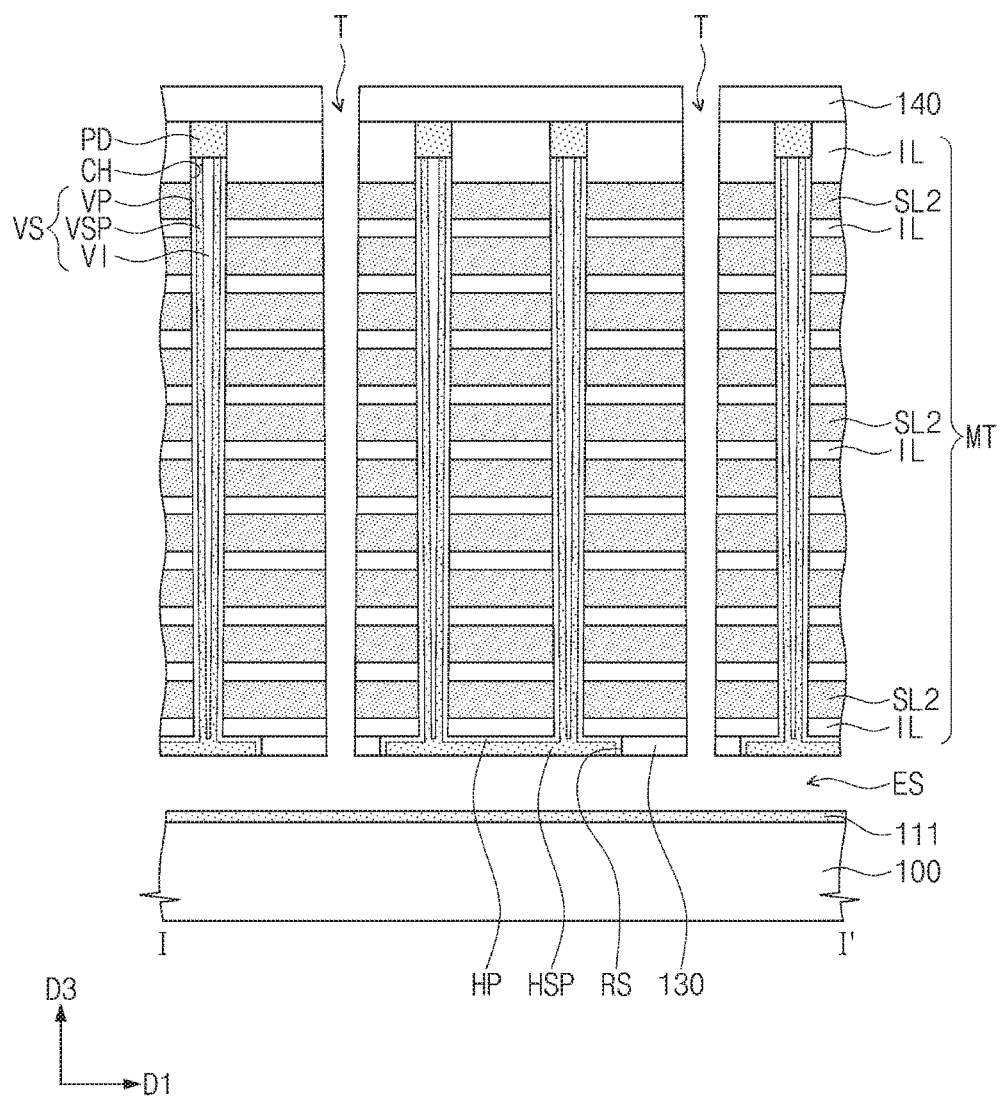
Figure 13B:
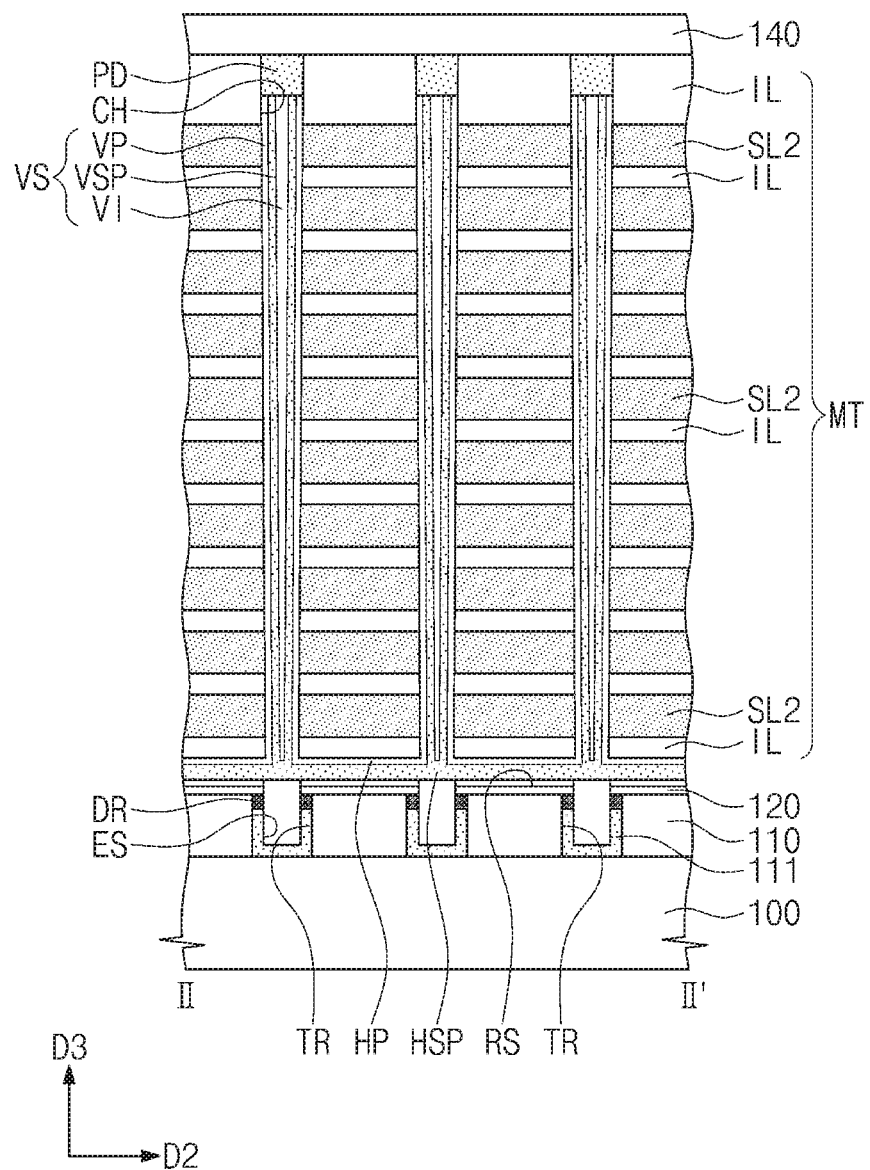

Referring to FIGS. 3, 13A and 13B, the first sacrificial patterns SL1 exposed by the vertical trenches T may be completely etched to form empty spaces ES. The first sacrificial patterns SL1 may be selectively etched by an isotropic etching process.

The buffer insulating layer 120, lower portions of the horizontal insulating patterns HP and lower portions of the horizontal semiconductor patterns HSP that are exposed by the empty spaces ES may be sequentially etched. Portions of bottom surfaces of the horizontal semiconductor patterns HSP may be exposed by the empty spaces ES.

Figure 14A:
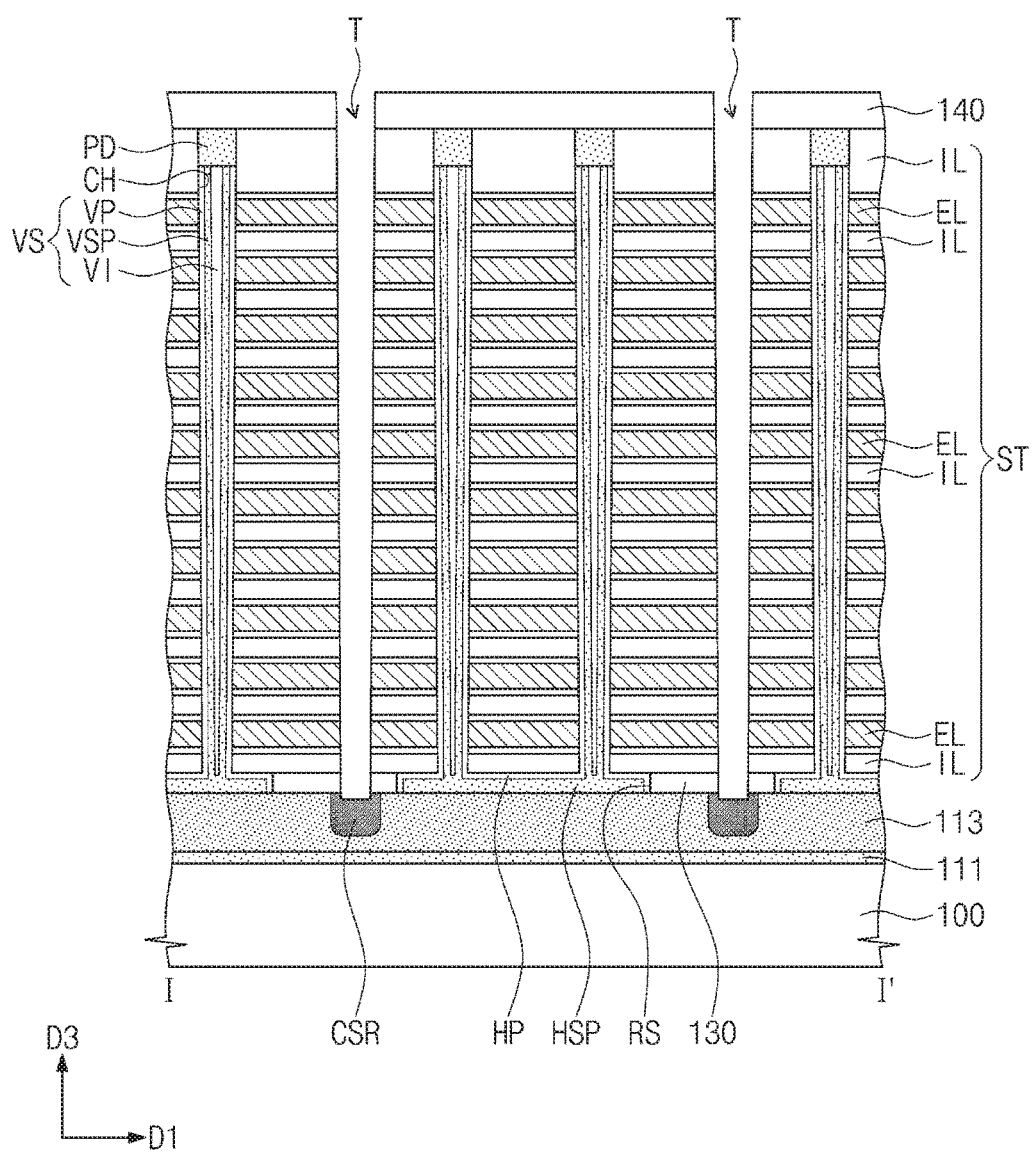
Figure 14B:
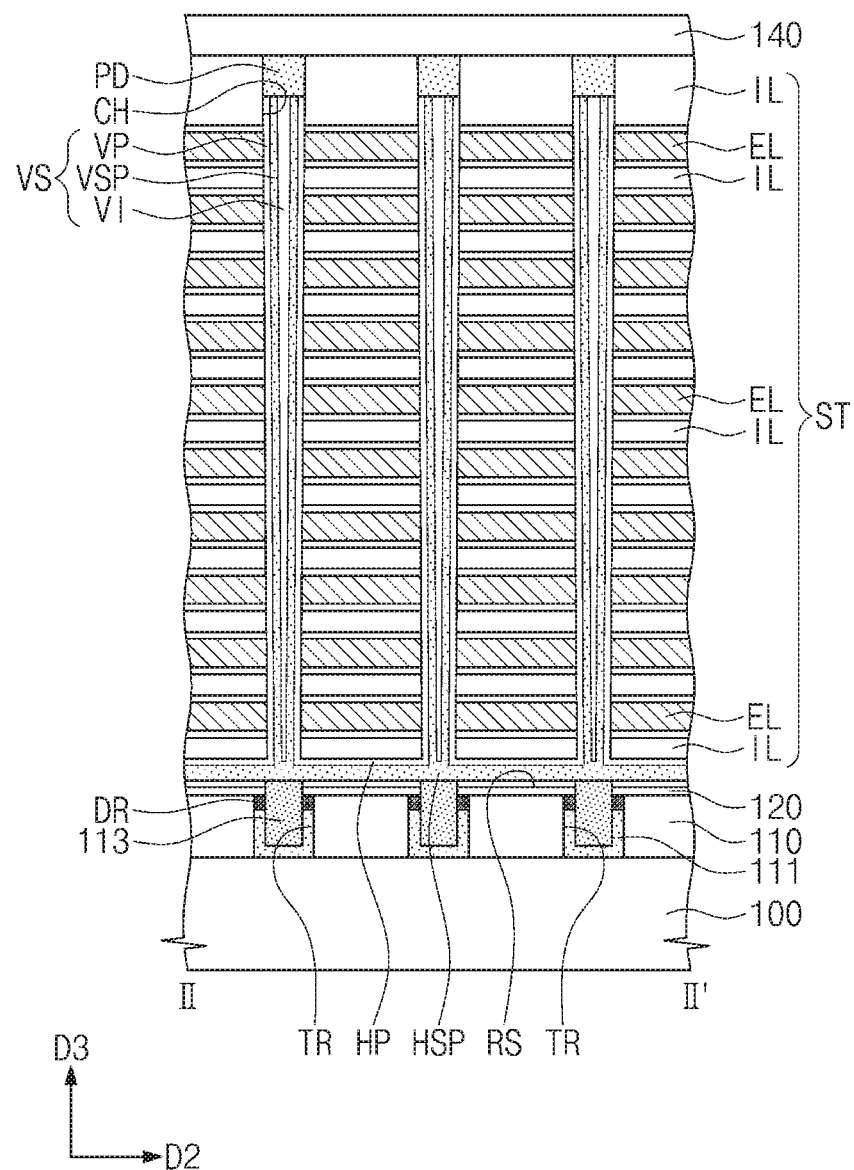

Referring to FIGS. 3, 14A and 14B, second connection semiconductor patterns 113 may be formed to fill the empty spaces ES. Each of the second connection semiconductor patterns 113 may be extend in the first direction D1 and may electrically connect the horizontal semiconductor patterns HSP spaced from one another in the first direction D1. The vertical and horizontal semiconductor patterns VSP and HSP may be electrically connected to the substrate 100 via the first and second connection semiconductor patterns 111 and 113.

The second connection semiconductor patterns 113 remaining in the vertical trenches T may be removed to expose sidewalls of the second sacrificial layers SL2 and sidewalls of insulating layers IL. The second sacrificial layers SL2 exposed by the vertical trenches T may be replaced with electrodes EL such that stack structures ST including the insulating layers IL and the electrodes EL that are vertically alternately stacked on each other may be formed. For example, the second sacrificial layers SL2 exposed by the vertical trenches T may be selectively removed and the electrode EL may be formed in spaces from which the second sacrificial layers SL2 are removed. The electrodes EL may include doped semiconductor (e.g., doped silicon, etc.), metal (e.g., tungsten, copper, aluminum, etc.), conductive metal nitride (e.g., titanium nitride, tantalum nitride, etc.) and/or transition metal (e.g., titanium, tantalum, etc.).

The second connection semiconductor patterns 113 exposed by the vertical trenches T may be doped with an impurity to form common source regions CSR. For example, the common source regions CSR may be doped with an impurity such as arsenic (As) or phosphorus (P) to have an n-type.

Referring again to FIGS. 3, 4A and 4B, the insulating spacers SL and the respective common source plugs CSP may be sequentially formed to fill each of the vertical trenches T. The common source plugs CSP may be connected to the common source regions CSR, respectively. The insulating spacers SL may be formed of silicon oxide, silicon nitride or silicon oxynitride. The common source plugs CSP may be formed of doped semiconductor, metal, metal nitride and/or transition metal.

The second interlayer insulating layer 150 may be formed on the first interlayer insulating layer 140. The bit line contact plugs BPLG may be formed to penetrate the first and second interlayer insulating layers 140 and 150 and may be connected to the vertical structures VS, respectively. The bit lines BL may be formed on the second interlayer insulating layer 150 to be electrically connected to the bit line contact plugs BPLG.

In the method of manufacturing the three-dimensional semiconductor device according to the example embodiments, the horizontal semiconductor patters HSP may be formed in a self-aligned manner through the wet etch process using the channel holes CH and the depositing process. In other words, a patterning process using a photolithography process to form the horizontal semiconductor patters HSP may be omitted. Furthermore, when forming the common source plugs CSP, shorts between the horizontal semiconductor patterns HSP and the common source plugs CSP that are caused by misalignments of the common source plugs CSP may be prevented.

Figure 15:
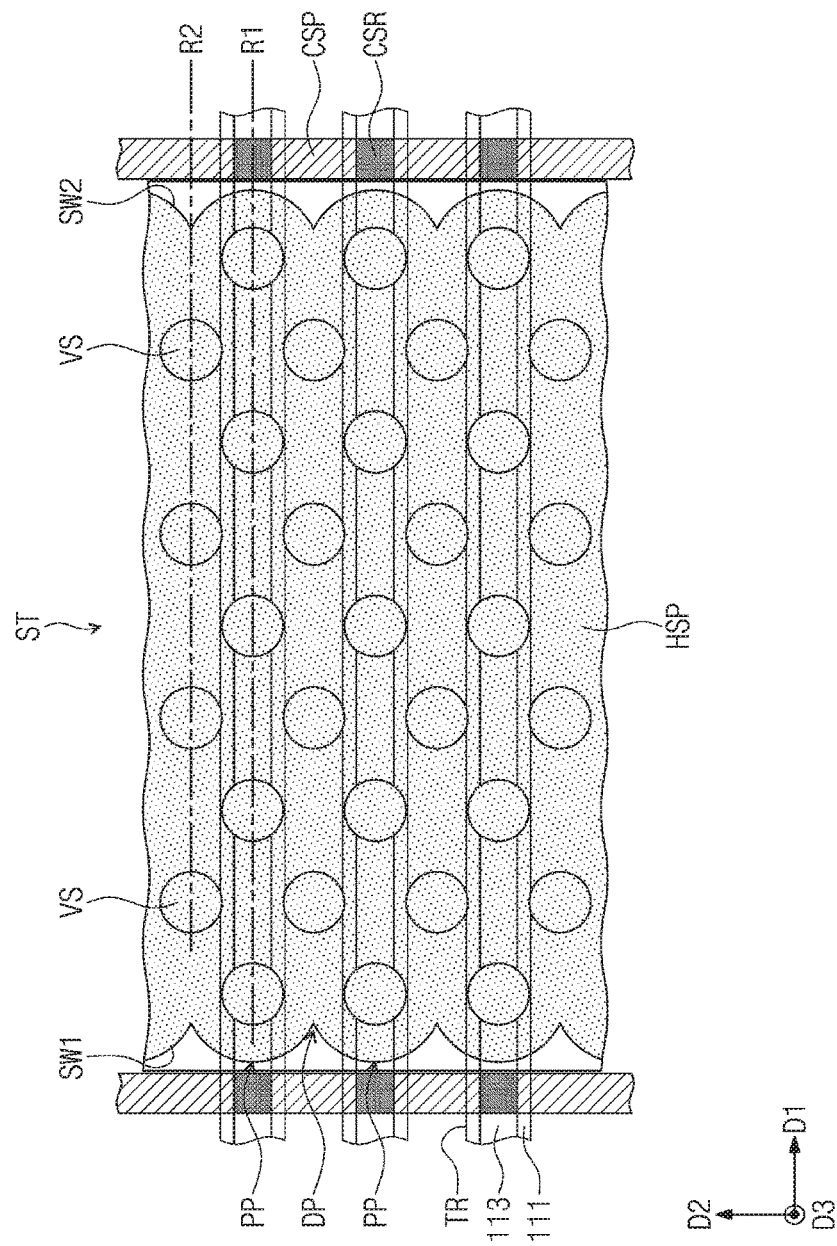
FIG. 15 is a plan view illustrating a three-dimensional semiconductor device according to example embodiments.

FIG. 15 is a plan view illustrating a three-dimensional semiconductor device according to example embodiments. In example embodiments of FIG. 15, repeated descriptions of the same elements as described in FIGS. 3, 4A, 4B, 5 and 6 are omitted.

Referring to FIG. 15, vertical structures VS may penetrate one stack structure ST. The vertical structures VS may configure first rows R1 and second rows R2. The first rows R1 may each include five vertical structures VS arranged in a row along the first direction D1. The second rows R2 may each include four vertical structures VS arranged in a row in the first direction D1. The first and second rows R1 and R2 may be alternately arranged along the second direction D2.

Vertical structures VS penetrating the one stack structure ST may be connected to horizontal semiconductor pattern HSP below the stack structure ST. The vertical structures VS may each include a vertical insulating pattern VP, a vertical semiconductor pattern VSP and a buried insulating pattern VI. A first sidewall SW1 and a second sidewall SW2 of the horizontal semiconductor pattern HSP may each include protrusions PP and depressions DP therebetween. In plan view, the protrusions PP may be adjacent to outermost vertical structures VS of the first rows R1. In plan view, the depressions DP may be toward outermost vertical structures VS of the second rows R2.

Figure 16:
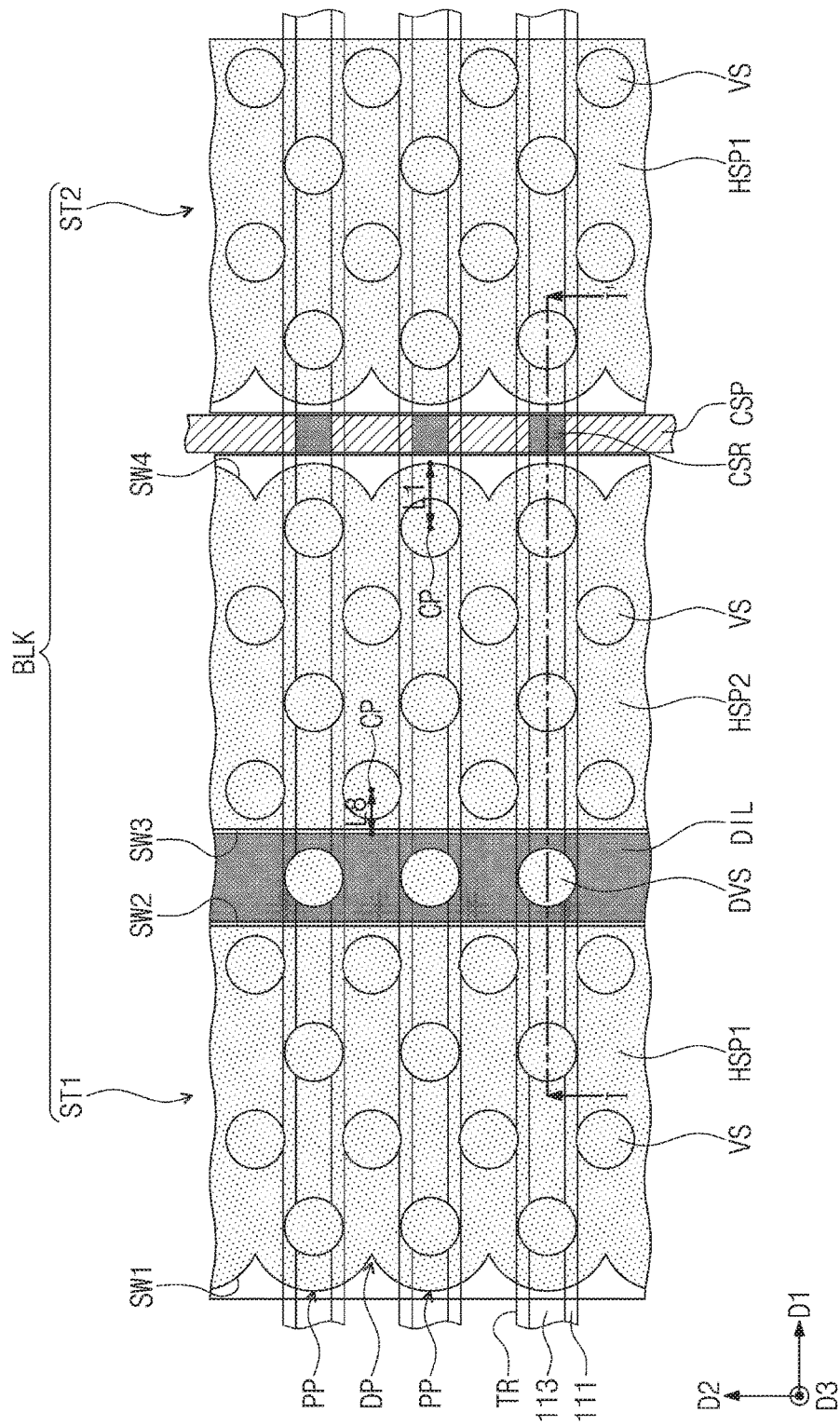
FIG. 16 is a plan view illustrating a three-dimensional semiconductor device according to example embodiments.
Figure 17:
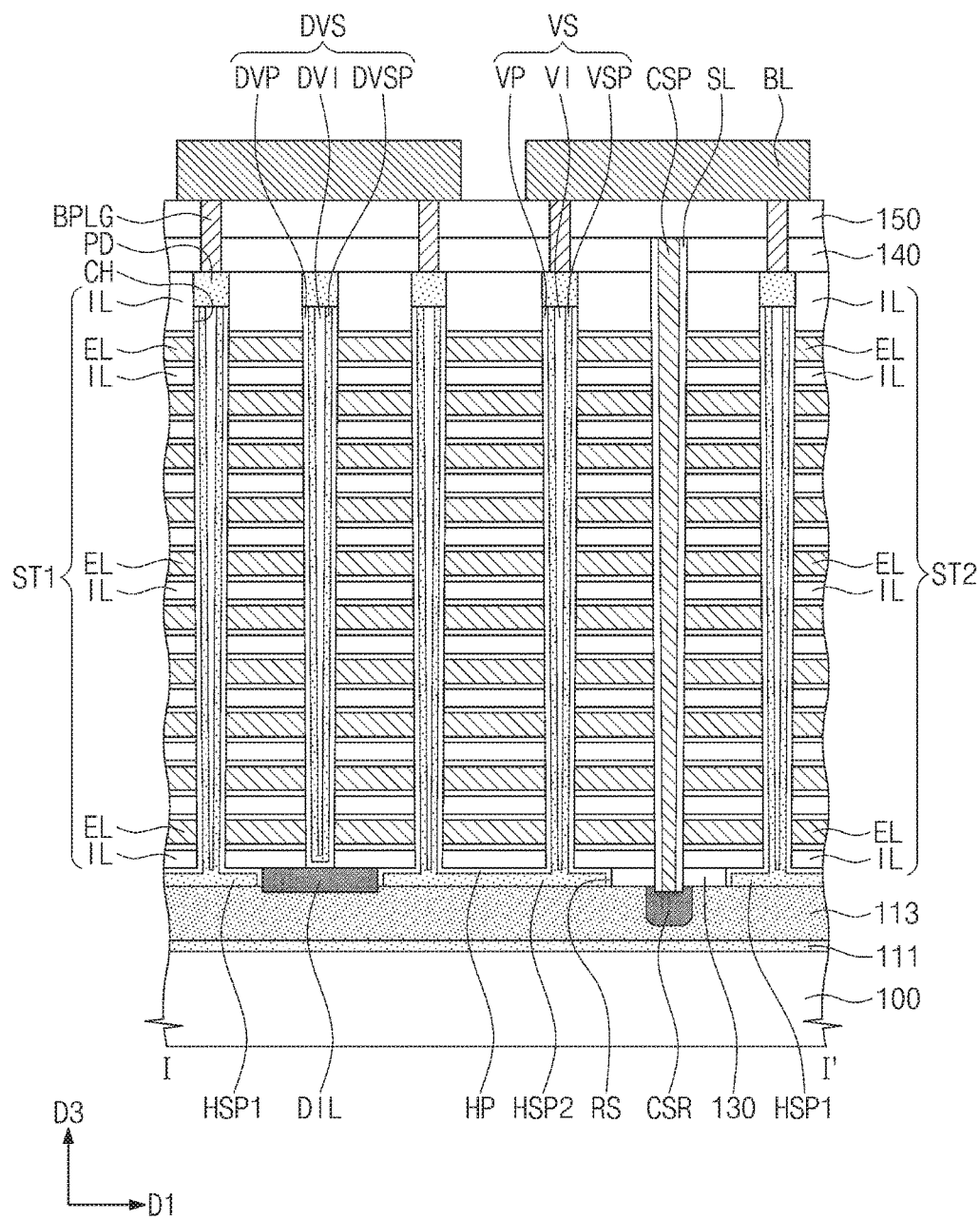
FIG. 17 is a cross-sectional view taken along line I-I' of FIG. 16, illustrating a three-dimensional semiconductor device according to example embodiments.

FIG. 16 is a plan view illustrating a three-dimensional semiconductor device according to example embodiments. FIG. 17 is a cross-sectional view taken along line I-I' of FIG. 16, illustrating a three-dimensional semiconductor device according to example embodiments. In example embodiments of FIGS. 16 and 17, repeated descriptions of the same elements as described in FIGS. 3, 4A, 4B, 5 and 6 are omitted.

Referring to FIGS. 16 and 17, the lower layer 130 may include at least one dummy impurity region DIL extending in the second direction D2. The dummy impurity region DIL may extend across the first and second connection semiconductor patterns 111 and 113. The dummy impurity region DIL may include an impurity (e.g., carbon).

A first stack structure ST1 and a second stack structure ST2 may be provided on the lower layer 130. A common source plug CSP may extend in the second direction D2 between the first and second stack structures ST1 and ST2. Hereinafter, descriptions on the first stack structure ST1 are made in detail. The second stack structure ST2 may be the same as the first stack structure ST1.

The dummy impurity region DIL may be provided below the first stack structure ST1. In plan view, the dummy impurity region DIL may extend along a central line of the first stack structure ST1 and may extend in the second direction D2 together with the first stack structure ST1.

A first horizontal semiconductor pattern HSP1 and a second horizontal semiconductor pattern HSP2 may be provided below the first stack structure ST1. The dummy impurity region DIL may be interposed between the first and second horizontal semiconductor patterns HSP1 and HSP2.

The first horizontal semiconductor pattern HSP1 may include opposite first and second sidewalls SW1 and SW2. The second horizontal semiconductor pattern HSP2 may include opposite third and fourth sidewalls SW3 and SW4. The second sidewall SW2 and the third sidewall SW3 may face each other with the dummy impurity region DIL therebetween. The first sidewall SW1 and the fourth sidewall SW4 may each include protrusions PP and depressions DP between the protrusions PP along the second direction D2. The second sidewall SW2 and the third sidewall SW3 may have an even profile or a linear profile along the second direction D2.

Referring to FIG. 16, in plan view, a distance between the fourth sidewall SW4 and a central point of the vertical structure VS adjacent thereto may be a first length L1. A distance between the third sidewall SW3 and a central point of the vertical structure VS adjacent thereto may be an eighth length L8. The eighth length L8 may be less than the first length (L8<L1).

Referring again to FIGS. 6 and 7, dummy vertical structures DVS may be provided to penetrate the first stack structure ST1. The dummy vertical structures DVS may vertically overlap the dummy impurity region DIL. The dummy vertical structures DVS may be arranged in a row along the second direction D2.

The dummy vertical structures DVS may each include a dummy vertical insulating pattern DVP, a dummy vertical semiconductor pattern DVSP and a dummy buried insulating pattern DVI. The dummy vertical insulating pattern DVP may include the same material as the vertical insulating pattern VP of the vertical structure VS. The dummy vertical semiconductor pattern DVSP may include the same material as the vertical semiconductor pattern VSP of the vertical structure VS. The dummy buried insulating pattern DVI may include the same material as the buried insulating pattern VI of the vertical structure VS. The dummy vertical structures DVS and the vertical structures VS may be formed at the same time together.

The dummy vertical semiconductor patterns DVSP of the dummy vertical structures DVS may be spaced apart from the dummy impurity region DIL with the dummy vertical insulating pattern DVP therebetween. The dummy vertical structures DVS may not be connected to the bit line contact plugs BPLG. The dummy vertical structures DVS may not be electrically connected to the substrate 100 and the bit line BL.

FIGS. 18 to 23 are cross-sectional views illustrating a method of manufacturing a three-dimensional semiconductor device according to example embodiments, taken along line I-I' of FIG. 16. In example embodiments of FIGS. 16, 18 to 23, repeated descriptions of the same elements as described in FIGS. 3 and 7A to 14B are omitted.

Figure 18:
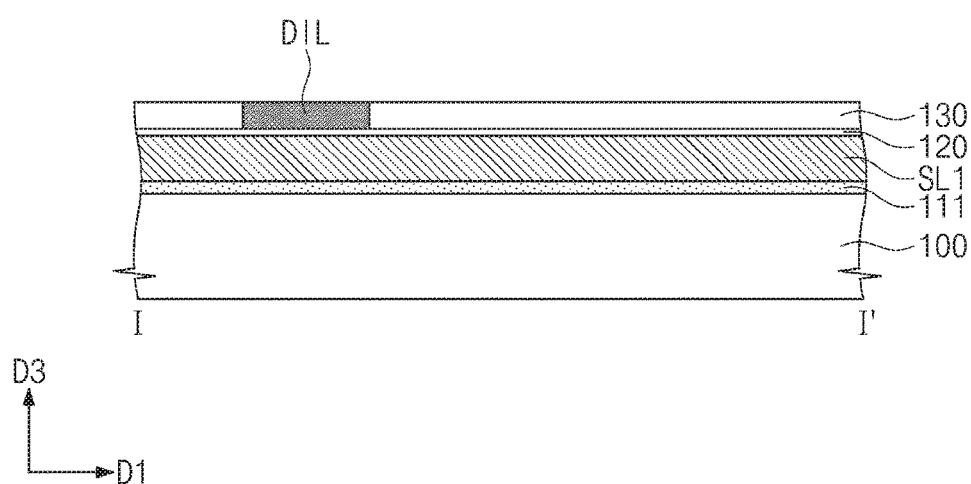
FIGS. 18 to 23 are cross-sectional views illustrating a method of manufacturing a three-dimensional semiconductor device according to example embodiments, taken along line I-I' of FIG. 16.

Referring to FIGS. 16 and 18, at least one dummy impurity region DIL may be formed in the lower layer 130 on the substrate 100. The dummy impurity region DIL may extend in the second direction D2 across the first and second connection semiconductor patterns 111 and 113. The dummy impurity region DIL may be formed by doping an impurity (e.g., carbon) into the resulting structure of FIGS. 8A and 8B.

Figure 19:
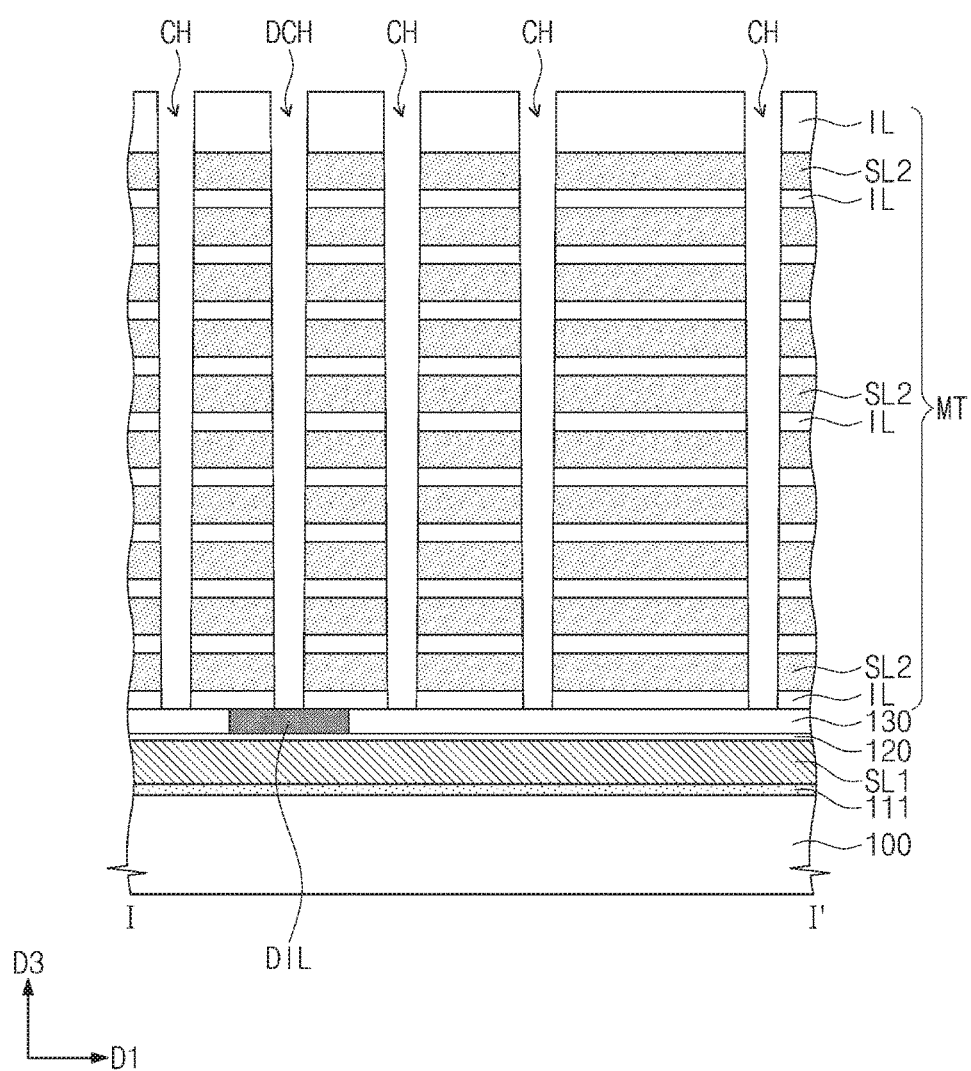

Referring to FIGS. 16 and 19, a mold structure MT including second sacrificial layers SL2 and insulating layers IL may be formed on the lower layer 130. Channel holes CH and dummy channel holes DCH penetrating the mold structure MT may be formed to exposed the lower layer 130. The dummy channel holes DCH may expose the dummy impurity region DIL in the lower layer 130. In plan view, arrangements or shapes of the channel holes CH and the dummy channel holes DCH may be substantially the same as or similar to those of the vertical structures VS and the dummy structures DVS described in FIGS. 16 and 17.

Figure 20:
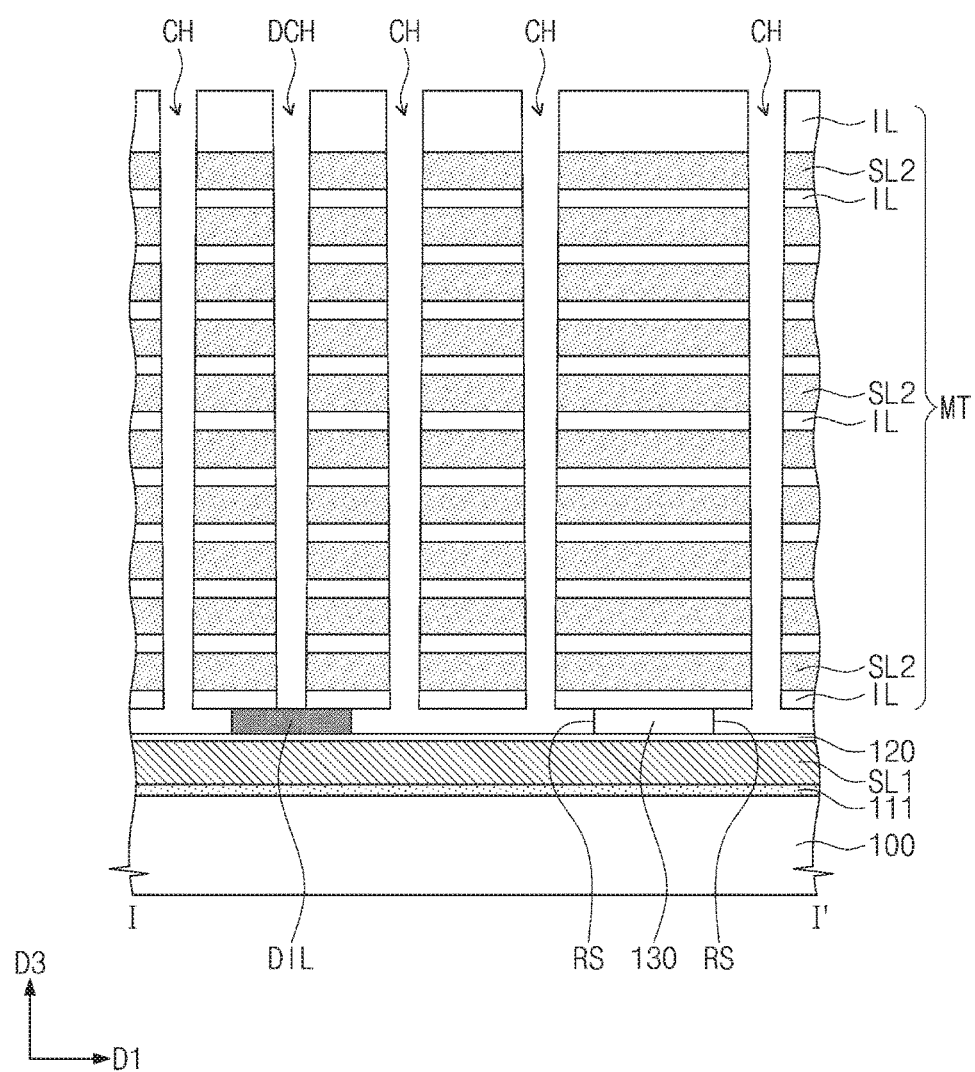

FIGS. 16 and 20, a wet etch process may be performed on the lower layer 130 exposed by the channel holes CH such that recess regions RS may be formed. The wet etch process may be performed using an etch recipe having an etch selectivity to the second sacrificial layers SL2, the insulating layers IL, the buffer insulating layer 120 and the dummy impurity region DIL. Thus, the dummy impurity region DIL may be act as an etch stopper in the wet etch process.

In plan view, sidewalls of the recess regions RS adjacent to the dummy impurity regions RS may have a linear profile along the second direction D2. In plan view, sidewalls of the recess regions RS adjacent to the remaining lower layer 130 may have an even profile (e.g., a wavy profile) along the second direction D2.

Figure 21:
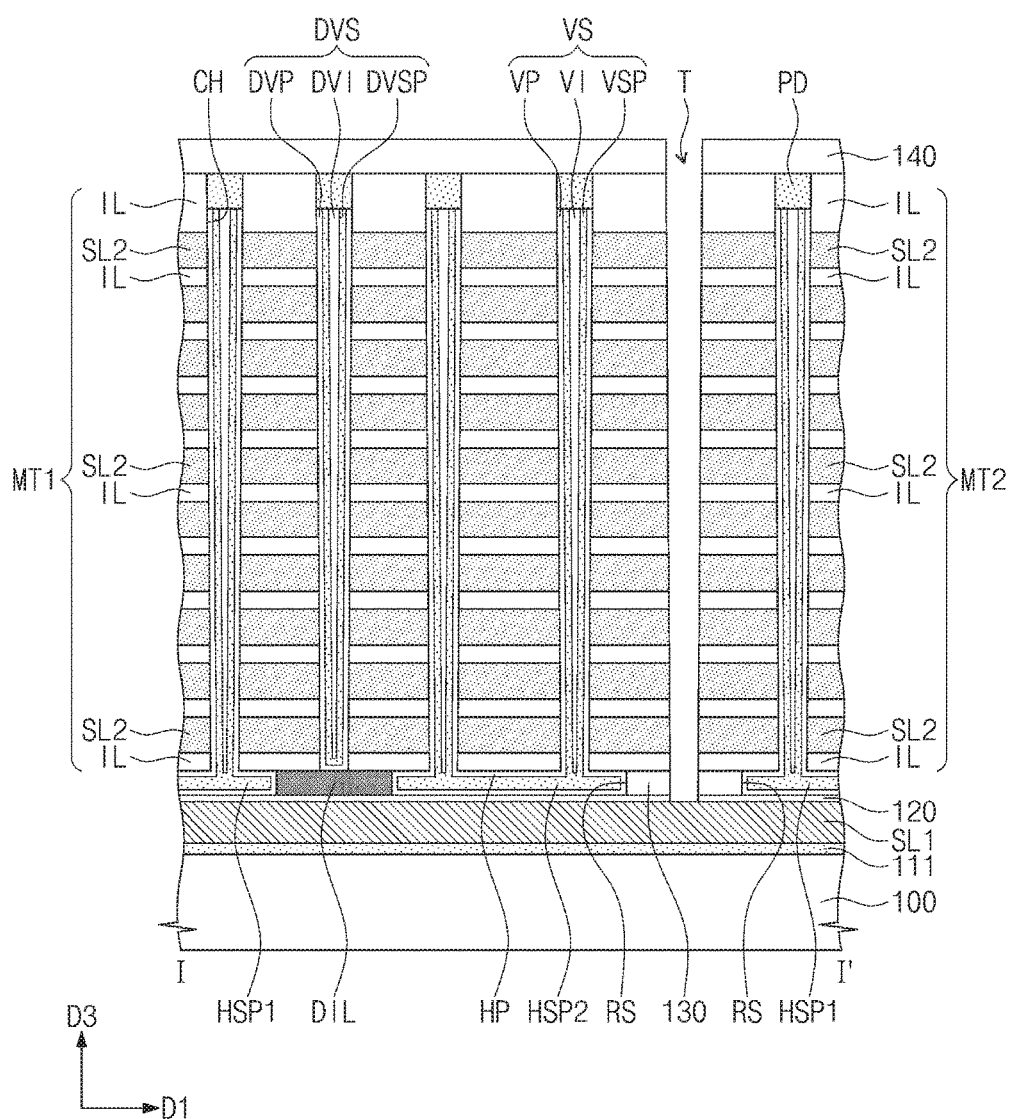

Referring to FIGS. 16 and 21, vertical structures VS may be formed in the channel holes CH. Dummy vertical structures DVS may be formed in the dummy channel holes DCH. The vertical structures VS may each include a vertical insulating pattern VP, a vertical semiconductor pattern VSP and a buried insulating pattern VI. The dummy vertical structures DVS may each include a dummy vertical insulating pattern DVP, a dummy vertical semiconductor pattern DVSP and a dummy buried insulating pattern DVI. Horizontal insulating patterns HP and horizontal semiconductor patterns HSP may be formed in the recess regions RS. The horizontal semiconductor patterns HSP may include a first horizontal semiconductor pattern HSP1 and a second horizontal semiconductor pattern HSP2 that are spaced apart from each other with the dummy impurity region DIL therebetween.

The dummy vertical insulating patterns DVP, the vertical insulating patterns VP and the horizontal insulating patterns HP may be simultaneously formed. The vertical insulating patterns VP may be integrally coupled with the horizontal insulating patterns HP. However, the dummy vertical insulating patterns DVP may be spaced apart from the horizontal insulating patterns HP.

The dummy vertical semiconductor patterns DVSP, the vertical semiconductor patterns VSP and the horizontal semiconductor patterns HSP may be simultaneously formed. The vertical semiconductor patterns VSP may be integrally coupled with the horizontal semiconductor patterns HSP. However, the dummy vertical semiconductor patterns DVSP may be spaced apart from the horizontal semiconductor patterns HSP, for example, the first and second horizontal semiconductor patterns HSP1 and HSP2.

A first interlayer insulating layer 140 may be formed on the mold structure MT. The first interlayer insulating layer 140 and the mold structure MT may be patterned to form at least one vertical trench T exposing portions of the first sacrificial patterns SL1. For example, the vertical trench T may divide the mold structure MT into a first mold structure MT1 and a second mold structure MT2.

Figure 22:
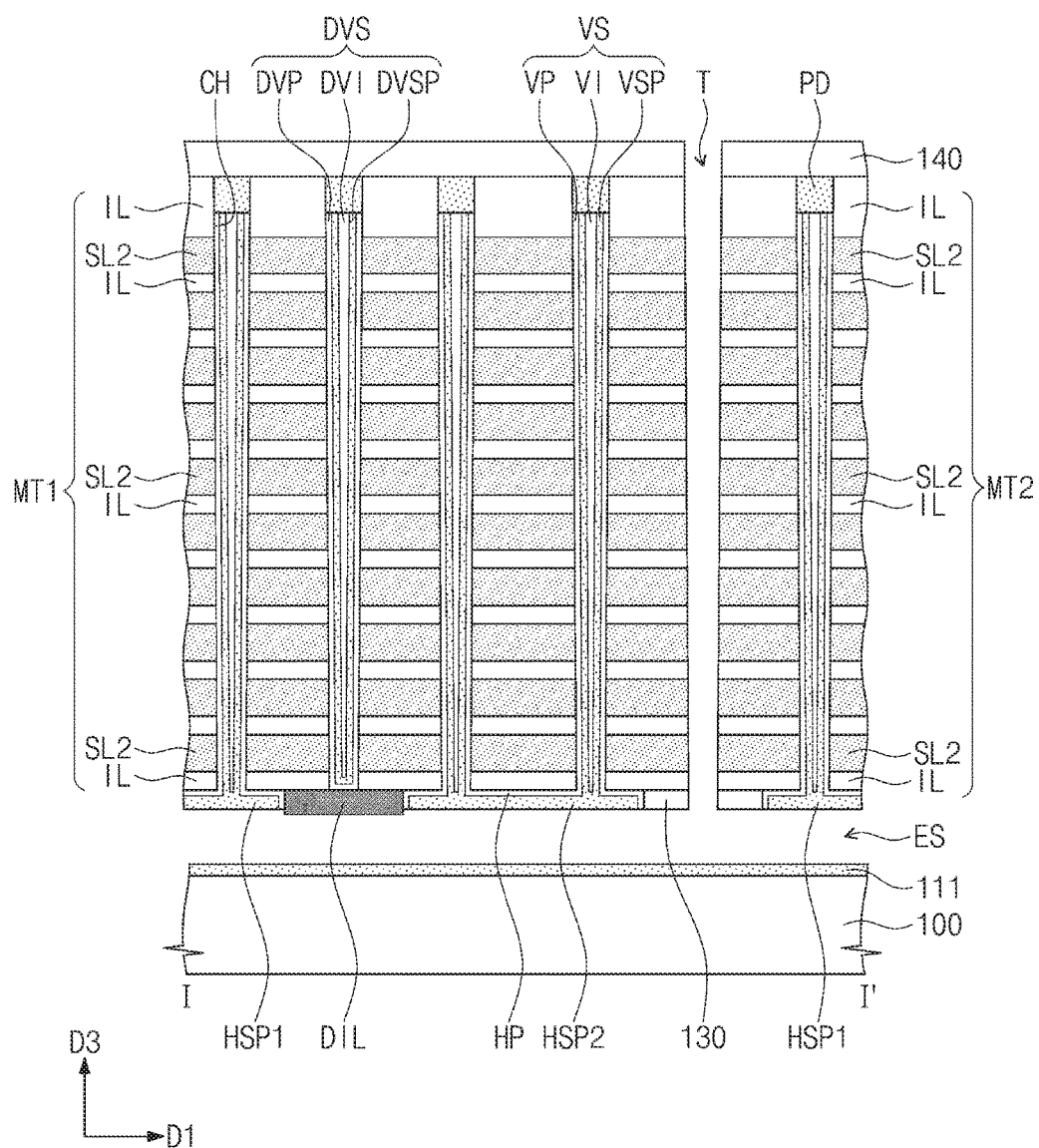

Referring to FIGS. 16 and 22, the first sacrificial patterns SL1 exposed by the vertical trench T may be completely removed to form empty spaces ES. The buffer insulating layer 120, lower portions of the horizontal insulating patterns HP and lower portions of the horizontal semiconductor patterns HSP that are exposed by the empty spaces ES may be sequentially etched.

Figure 23:
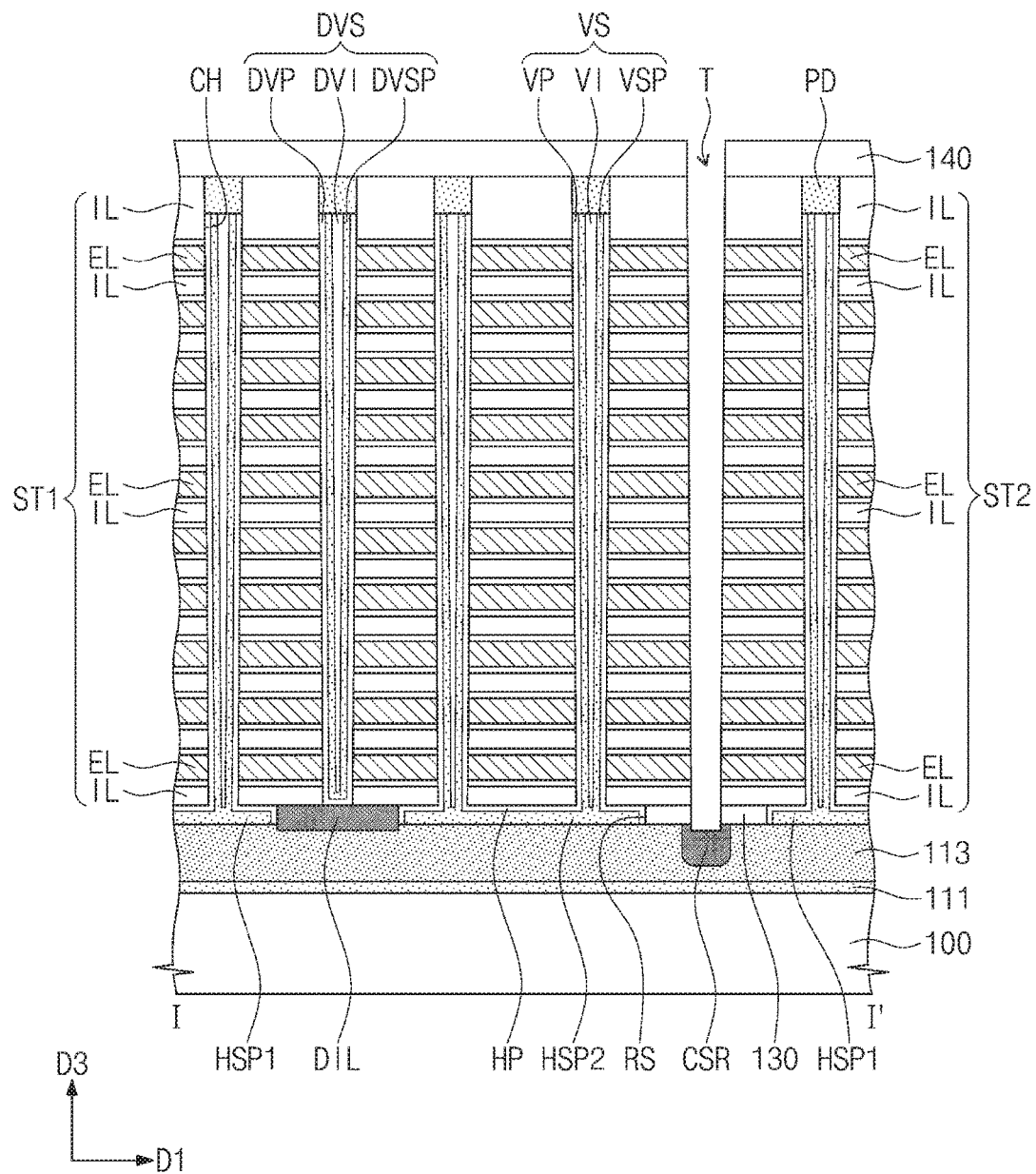

Referring to FIGS. 16 and 23, second connection semiconductor patterns 113 may be formed to fill the empty spaces ES. The second sacrificial layers SL2 of the first mold structure MT1 exposed by the vertical trench T may be replaced with electrodes EL such that a first stack structure ST1 may be formed. The second sacrificial layers SL2 of the second mold structure MT2 exposed by the vertical trench T may be replaced with electrodes EL such that a second stack structure ST2 may be formed. The second connection semiconductor patterns 113 exposed by the vertical trench T may be doped with an impurity to form common source regions CSR.

Referring again to FIGS. 16 and 17, insulating spaces SL and a common source plug CSP may be sequentially formed to fill the vertical trench T. A second interlayer insulating layer 150 may be formed on the first interlayer insulating layer 140. Bit line contact plugs BPLG penetrating the first and second interlayer insulating layers 140 and 150 may be formed to be connected to the vertical structures VS, respectively. The bit line contact plugs BPLG may be spaced from the dummy vertical structures DVS. Bit lines BL may be formed on the second interlayer insulating layer 150 and may be electrically connected to the bit line contact plugs BPLG.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:

1. A three-dimensional semiconductor memory device, comprising:
a stack structure including insulating layers and electrodes that are alternately stacked on a substrate;
a horizontal semiconductor pattern between the substrate and the stack structure;
vertical semiconductor patterns penetrating the stack structure and connected to the horizontal semiconductor pattern; and
a common source plug at a side of the stack structure, wherein
the stack structure, the horizontal semiconductor pattern and the common source plug extend in a first direction,
the horizontal semiconductor pattern has a first sidewall extending in the first direction, and the first sidewall includes protrusions protruding toward the common source plug.

2. The device of claim 1, wherein
a first vertical semiconductor pattern of the vertical semiconductor patterns is adjacent to a first protrusion of the protrusions,
in plan view, a first distance between a first point of the first protrusion and a central point of the first vertical semiconductor pattern is a first length,
in plan view, a second distance between a second point of the first protrusion and the central point of the first vertical semiconductor pattern is a second length, and
the first length is substantially equal to the second length.

3. The device of claim 2, wherein
a second vertical semiconductor pattern of the vertical semiconductor patterns is adjacent to the first vertical semiconductor pattern,
in plan view, a third distance between the central point of the first vertical semiconductor pattern and a central point of the second vertical semiconductor pattern is a third length, and the third length is less than two times the first length.

4. The device of claim 3, wherein in plan view, a minimum distance between a sidewall of the stack structure and the central point of the first vertical semiconductor pattern is a fourth length, and the fourth length is greater than the first length.

5. The device of claim 1, wherein
the vertical semiconductor patterns are configured in a first column and a second column,
the first column and the second column respectively include the vertical semiconductor patterns arranged in a row in the first direction, and
the vertical semiconductor patterns of the first column are adjacent to the protrusions.

6. The device of claim 5, wherein the first sidewall includes depressions between the protrusions, and the depressions are toward the vertical semiconductor patterns of the second column.

7. The device of claim 1, wherein the horizontal semiconductor pattern further has a second sidewall opposite to the first sidewall, and the second sidewall includes protrusions along the first direction.

8. The device of claim 1, wherein the horizontal semiconductor pattern further has a second sidewall opposite to the first sidewall, and in plan view, the second sidewall has a linear profile along the first direction.

9. The device of claim 1, further comprising data storage layers between the electrodes and the vertical semiconductor patterns.

10. The device of claim 1, wherein the horizontal semiconductor pattern and the vertical semiconductor patterns include a same material.

11. The device of claim 1, further comprising:
connection semiconductor patterns between the substrate and the horizontal semiconductor pattern and common source regions in the connection semiconductor patterns,
wherein
the connection semiconductor patterns extend in a second direction crossing the first direction and electrically connect the horizontal semiconductor pattern to the substrate, and
the common source plug is connected to the common source regions.

12. The device of claim 1, wherein, in plan view, each of the protrusions has a curvature greater than zero.

13. The device of claim 1, wherein the first sidewall further includes depressions between neighboring pairs of the protrusions.

14. A three-dimensional semiconductor memory device, comprising:
- a stack structure, on a substrate, extending in a first direction, the stack structure including electrodes vertically stacked while being spaced apart from one another;
- a horizontal semiconductor pattern between the substrate and the stack structure, the horizontal semiconductor pattern extending in the first direction; and
- vertical semiconductor patterns penetrating the stack structure and connected to the horizontal semiconductor pattern;
- wherein the horizontal semiconductor pattern has a first sidewall extending in the first direction, and in plan view, the first sidewall has an uneven profile along the first direction.

15. The device of claim 14, wherein the first sidewall includes protrusions protruding in a second direction crossing the first direction.

16. The device of claim 15, wherein
- the vertical semiconductor patterns are configured in a first column and a second column,
- each of the first column and the second column includes the vertical semiconductor patterns arranged in a row in the first direction, and
- the vertical semiconductor patterns of the first column are adjacent to the protrusions, respectively.

17. The device of claim 14, wherein the horizontal semiconductor pattern vertically overlaps the stack structure and has a maximum width in a second direction crossing the first direction less than a maximum width of the stack structure in the second direction.

18. The device of claim 14, wherein
- the stack structure includes a plurality of stack structures arranged in a second direction crossing the first direction,
- the device further comprising common source plugs between the plurality of stack structures.

19. A three-dimensional semiconductor memory device, comprising:
- a stack structure including insulating layers and electrodes that are alternately stacked on a substrate;
- a horizontal semiconductor pattern between the substrate and the stack structure;
- vertical semiconductor patterns penetrating the stack structure and connected to the horizontal semiconductor pattern; and
- a first common source plug and a second common source plug at opposite sides of the stack structure, respectively,
- the horizontal semiconductor pattern including a first sidewall adjacent to the first common source plug and a second sidewall adjacent to the second common source plug, and
- a first distance between the first sidewall and the first common source plug being different from a second distance between the second sidewall and the second common source plug.

20. The device of claim 19, wherein
- the first sidewall includes a protrusion protruding toward the first common source plug, and
- the second sidewall includes a depression that is recessed away from the second common source plug.

* * * * *